(12) United States Patent
Russell, Jr.

(10) Patent No.: US 7,334,199 B1
(45) Date of Patent: Feb. 19, 2008

(54) SYSTEM AND METHOD FOR BREAKING A FEEDBACK LOOP USING A VOLTAGE CONTROLLED VOLTAGE SOURCE TERMINATED SUBNETWORK MODEL

(75) Inventor: Howard T. Russell, Jr., Azle, TX (US)

(73) Assignee: National Semiconductor Corporation, Santa Clara, CA (US)

( * ) Notice: Subject to any disclaimer, the term of this patent is extended or adjusted under 35 U.S.C. 154(b) by 619 days.

(21) Appl. No.: 10/793,304

(22) Filed: Mar. 4, 2004

(51) Int. Cl.
*G06F 17/50* (2006.01)

(52) U.S. Cl. .......................................... 716/1; 702/196
(58) Field of Classification Search .................... 716/1; 702/196
See application file for complete search history.

(56) References Cited

U.S. PATENT DOCUMENTS

| | | | |
|---|---|---|---|
| 3,746,889 A * | 7/1973 | Cubbison, Jr. | 327/39 |
| 5,404,310 A * | 4/1995 | Mitsuhashi | 716/13 |
| 5,946,482 A * | 8/1999 | Barford et al. | 703/14 |
| 6,057,731 A * | 5/2000 | Gorcea et al. | 330/69 |
| 6,618,837 B1 * | 9/2003 | Zhang et al. | 716/4 |
| 6,842,012 B2 * | 1/2005 | Belge et al. | 324/637 |
| 6,995,608 B2 * | 2/2006 | Onete | 327/564 |
| 2005/0027491 A1 * | 2/2005 | Fertner et al. | 702/196 |

OTHER PUBLICATIONS

Fliege N. "Complementary transformation of feedback systems", Circuits and Systems, IEEE Transactions, vol. 20, Issue 2, Mar. 1973 pp. 137-139.*
Howard T. Russell, Jr., "A Loop-Breaking Method for the Analysis and Simulation of Feedback Amplifiers", IEEE Transactions on Circuit and Systems-I: Fundamental Theory and Applications, vol. 49 No. 8 Aug. 2002 pp. 1045-1061.

* cited by examiner

*Primary Examiner*—Thuan Do
*Assistant Examiner*—Naum Levin

(57) ABSTRACT

A system and method is disclosed for breaking a feedback loop by replacing at least one component in the feedback loop with a model containing two physically disconnected subnetworks that have terminals that are connected to ground with voltage controlled, voltage sources (VCVSs). Dependent source parameters of the VCVSs control lateral signal transfer though the model allowing the feedback loop to be opened or closed. The model maybe used in a software simulation in which a replicate circuit is used to set and maintain a closed-loop bias on the open-loop circuit. Small-signal analysis of the equivalent open-loop circuit allows extraction of transfer functions that yield a return ratio $RR(s)$ corresponding to the modeled component.

19 Claims, 16 Drawing Sheets

$$
\begin{bmatrix} V_1(s) & \cdots & V_k(s) & V_{k+1}(s) & \cdots & V_m(s) & V_{m+1}(s) & \cdots & V_n(s) \end{bmatrix}
$$

$$
\cdot
$$

$$
\begin{bmatrix}
y_{1,1}(s) & \cdots & y_{k,1}(s) & y_{k+1,1}(s) & \cdots & y_{m,1}(s) & y_{m+1,1}(s) & \cdots & y_{n,1}(s) \\
\vdots & & \vdots & \vdots & & \vdots & \vdots & & \vdots \\
y_{1,k}(s) & \cdots & y_{k,k}(s) & y_{k+1,k}(s) & \cdots & y_{m,k}(s) & y_{m+1,k}(s) & \cdots & y_{n,k}(s) \\
y_{1,k+1}(s) & \cdots & y_{k,k+1}(s) & y_{k+1,k+1}(s) & \cdots & y_{m,k+1}(s) & y_{m+1,k+1}(s) & \cdots & y_{n,k+1}(s) \\
\vdots & & \vdots & \vdots & & \vdots & \vdots & & \vdots \\
y_{1,m}(s) & \cdots & y_{k,m}(s) & y_{k+1,m}(s) & \cdots & y_{m,m}(s) & y_{m+1,m}(s) & \cdots & y_{n,m}(s) \\
y_{1,m+1}(s) & \cdots & y_{k,m+1}(s) & y_{k+1,m+1}(s) & \cdots & y_{m,m+1}(s) & y_{m+1,m+1}(s) & \cdots & y_{n,m+1}(s) \\
\vdots & & \vdots & \vdots & & \vdots & \vdots & & \vdots \\
y_{1,n}(s) & \cdots & y_{k,n}(s) & y_{k+1,n}(s) & \cdots & y_{m,n}(s) & y_{m+1,n}(s) & \cdots & y_{n,n}(s)
\end{bmatrix}
$$

$$
=
$$

$$
\begin{bmatrix} I_1(s) & \cdots & I_k(s) & I_{k+1}(s) & \cdots & I_m(s) & I_{m+1}(s) & \cdots & I_n(s) \end{bmatrix}
$$

FIG. 4

$$[Y_{IAMQmB}(s)] = \begin{bmatrix} g_{\pi a} + s(C_{\pi a} + C_{\mu a}) & -sC_{\mu a}\mu_C & -(g_{\pi a} + sC_{\pi a})\mu_E \\ -(sC_{\mu b} - g_{mb})\mu_B & g_{ob} + sC_{\mu b} & -(g_{ob} + g_{mb}) \\ -(g_{mb} + g_{\pi b} + sC_{\pi b})\mu_B & -g_{ob} & g_{mb} + g_{ob} + g_{\pi b} + sC_{\pi b} \end{bmatrix}$$

FIG. 15

$$[Y_{IAMQmE}(s)] = \begin{bmatrix} g_{oa} + g_{ma} + g_{\pi a} + sC_{\pi a} & -g_{oa}\mu_C & -(g_{ma} + g_{\pi a} + sC_{\pi a})\mu_B \\ -(g_{ob} + g_{mb})\mu_E & g_{ob} + sC_{\mu b} & -(sC_{\mu b} - g_{mb}) \\ -(g_{\pi b} + sC_{\pi b})\mu_E & -sC_{\mu b} & g_{\pi b} + s(C_{\pi b} + C_{\mu b}) \end{bmatrix}$$

FIG. 18

$$[Y_{IAMQmC}(s)] = \begin{bmatrix} g_{oa} + sC_{\mu a} & -(sC_{\mu a} - g_{ma})\mu_B & -(g_{oa} + g_{ma})\mu_E \\ -(sC_{\mu b})\mu_c & g_{\pi b} + s(C_{\pi b} + C_{\mu b}) & -(g_{\pi b} + sC_{\pi b}) \\ -(g_{ob})\mu_c & -(g_{mb} + g_{\pi b} + sC_{\pi b}) & g_{\pi b} + g_{mb} + g_{ob} + sC_{\pi b} \end{bmatrix}$$

SYSTEM AND METHOD FOR BREAKING A FEEDBACK LOOP USING A VOLTAGE CONTROLLED VOLTAGE SOURCE TERMINATED SUBNETWORK MODEL

TECHNICAL FIELD OF THE INVENTION

The present invention is generally directed to electronic circuits of the type that comprise a feedback loop and, in particular, to a system and method for breaking a feedback loop using a voltage controlled voltage source (VCVS) terminated subnetwork model.

BACKGROUND OF THE INVENTION

In performing computer aided analysis and simulation of feedback circuits, it is often desirable to break the feedback loop to study and evaluate circuit behavior under open-loop conditions. One of the most important performance specifications determined from open-loop configurations is stability. When the feedback loop is properly broken then stability is easily determined from frequency response plots of the gain around the loop (known as loop-gain).

Quantitative measures of stability as well as approximate degrees of stability can be determined from performance parameters taken from the log magnitude and phase plots (Bode plots) of loop-gain. Gain margin is a term that refers to a factor by which the magnitude of loop-gain at a phase of minus one hundred eighty degrees (−180°) must be changed in order to produce an unstable circuit. A gain margin greater than one ("1") indicates a stable circuit while a gain margin less than one ("1") indicates an unstable circuit.

Phase margin is a term that refers to the amount of phase shift at a loop-gain of unity (i.e., when the value of the loop-gain equals one ("1")) that will cause the circuit to be unstable. A positive phase margin indicates a stable circuit while a negative phase margin indicates an unstable circuit.

The determinant ($\Delta_Y$) of a nodal admittance matrix $[Y_n(s)]$ of a feedback circuit contains the poles of the closed-loop system. The determinant can be expressed in a form that reveals the "return ratio" (designated RR(s)) and the "return difference" (designated F(s)). Specifically, $$\Delta_Y = det[Y_n(s)] = \Delta_1 + \Delta_2 = \Delta_1\left(1 + \frac{\Delta_2}{\Delta_1}\right) = \Delta_1[1 + RR(s)] = \Delta_1 F(s) \quad (1)$$

The form shown in Equation (1) is possible if $\Delta_1$ and $\Delta_2$ are derived from response functions computed from the circuit with its feedback loop open. After these terms have been found, the polar plot of the return ratio may be investigated with the Nyquist criteria to determine closed-loop stability. Additional background material concerning this topic may be found in a textbook entitled Active Network Analysis by W. K. Chen published by World Scientific Publishing Company, Teaneck, N.J., 1991.

Several methods that are suitable for determining the return ratio from an open-loop circuit have been published. For specific examples, one may refer to H. W. Bode, Network Analysis and Feedback Amplifier Design, Van Nostrand, N.Y., 1945; F. H. Blecher, "Design principles for single loop transistor feedback amplifiers," IRE Trans. Circ. Theory, Volume 4, No. 3, pp. 145-156, September 1957; R. D. Middlebrook, "Measurement of loop gain in feedback systems," Int. J. Electron., Volume 38, pp. 485-512, 1975; S. Rosenstark, "Loop gain measurement in feedback amplifiers," Int. J. Electron., Volume 57, pp. 415-421, 1984; P. J. Hurst, "Exact simulation of feedback circuit parameters," IEEE Trans. Circ. Syst., Volume 38, pp. 1382-1389, November 1991; P. J. Hurst and S. H. Lewis, "Determination of stability using return ratios in balanced fully differential feedback circuits," IEEE Trans. Circ. Syst. II, Volume 42, No. 12, pp. 805-817, December 1995; and H. T. Russell, Jr., "A loop-breaking method for the analysis and simulation of feedback amplifiers," IEEE Trans. Circ. Syst., Volume 49, pp. 1045-1061, August 2002.

In the feedback amplifier textbook by H. W. Bode the return ratio is defined as a function of a pre-selected dependent source parameter "k". With all independent sources removed from the circuit and with the chosen dependent source replaced by an independent source of the same type, the feedback loop is essentially broken allowing the feedback function f(s) to be computed. The return ratio is defined to be "k" times "f(s)". One problem with this method occurs in the application of the method to circuits that use complex transistor models. The dependent sources in these models are often deeply embedded in such a way that they are not easily accessible for replacement and calculation of the feedback function. This is especially true for circuits that use the models in a software-based circuit simulator such as the SPICE circuit simulator. The SPICE circuit simulator is a well-known software program that simulates the operation of electrical and electronic circuits.

In the method proposed in the Middlebrook reference (cited above) and later refined in the Rosenstark reference (cited above) the feedback loop is physically broken at an arbitrary point and test signals are injected into the break. The signals (both current and voltage) are used to compute a pair of transfer functions that describe the short-circuit current gain and the open-circuit voltage gain around the loop. A single expression for the return ratio of the circuit is computed from a combination of these functions. A major problem with this method is the necessity of performing multiple measurements required to generate the two transfer functions.

Another problem that is likely to be encountered with the prior art methods is associated with their application in SPICE simulations. When the feedback loop is broken, the closed-loop direct current (dc) bias point is no longer maintained. Consequently, the small-signal alternating current (ac) models of transistors and other non-linear devices will not be accurate because these models must be determined at closed-loop direct current (dc) values. Fortunately, the problem can be solved by applying prior art replicate biasing methods. Typical prior art replicate biasing methods are described in the above cited references (1) by P. J. Hurst, (2) by P. J. Hurst and S. H. Lewis, and (3) by H. T. Russell, Jr.

These prior art methods, however, require one or more of the following operations: (1) the replacement of a dependent source by an independent source of the same type, (2) multiple measurements and calculations performed to generate a single expression, and (3) the representation of components in the feedback loop as two-port networks. These prior art methods cannot be used if these operations cannot be performed (or are not performed).

Therefore, there is a need in the art for an improved system and method that is capable of breaking a feedback loop in a feedback circuit in which it is not necessary (1) to replace a dependent source with an independent source of the same type, (2) to perform multiple measurements and calculations for a single expression, and (3) to model components in the feedback loop as two-port networks.

SUMMARY OF THE INVENTION

To address the above-discussed deficiencies of the prior art, it is a primary object of the present invention to provide an efficient system and method for breaking a feedback loop in a feedback circuit in which the components of the feedback loop are not required to be represented as two-port components.

In one advantageous embodiment of the present invention components in the feedback loop are replaced with a model that contains two physically disconnected subnetworks that have terminals that are connected to ground with voltage controlled, voltage sources (VCVSs). By replacing components in the feedback loop with the model of the present invention, the open or closed condition of the loop is controlled by the dependent source parameters (i.e., gains) of the VCVSs. The nodal admittance characteristics of the model are identical to those of the components so that the circuit with these model components is equivalent to the circuit with the original components.

By setting all VCVS gains to be equal to one ("1"), the indefinite admittance matrix (IAM) of the equivalent circuit and the indefinite admittance matrix (IAM) of the original circuit are equal. Therefore, the feedback loops in both circuits are closed and both circuits have identical closed-loop poles. When certain VCVS gains are set equal to zero ("0"), the feedback loop of the equivalent circuit is broken, thereby allowing the equivalent circuit to operate in an open-loop condition. The return ratio RR(s) and other open-loop response functions are determined from the equivalent circuit using standard circuit analysis techniques.

The model of the present invention correctly models and is equivalent to multi-terminal networks that contain both linear and non-linear components. The model is also capable of exhibiting a physically disconnected topology between all possible combinations of the input terminals and the output terminals. Lateral signal transfer through the model is controlled in a simple switch-like "on" and "off" manner without removing and/or altering components.

The loading effects of the model on the rest of the circuit are not affected by the control of lateral signal transfer. For software simulation applications (e.g., SPICE software circuit analysis) the model is capable of maintaining a closed-loop direct current (dc) condition while simultaneously enabling an open-loop alternating current (ac) condition.

It is an object of the present invention to provide a system and method for breaking a feedback loop in a feedback circuit in order to study and evaluate circuit behavior under open-loop conditions.

It is also an object of the present invention to provide a system and method for breaking a feedback loop in a feedback circuit in order to study and evaluate performance specifications from an open-loop configuration.

It is another object of the present invention to provide a system and method for generating a voltage controlled voltage source terminated subnetwork model of at least one circuit component in a feedback circuit.

It is still another object of the present invention to provide a system and method for replacing a circuit component in a feedback loop with an equivalent voltage controlled voltage source terminated subnetwork model of the component that has a physically disconnected topology.

It is also an object of the present invention to provide a system and method for simulating in a software based circuit simulator a voltage controlled voltage source terminated subnetwork model of at least one circuit component in a feedback circuit.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the Detailed Description of the Invention below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior uses, as well as future uses, of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts:

FIG. 4 illustrates an "n by n" matrix that represents the indefinite admittance matrix (IAM) of "n"-terminal network $N_n$ of FIG. 3;

FIG. 15 illustrates a three by three matrix that represents an indefinite admittance matrix (IAM) for the voltage controlled voltage source (VCVS) terminated subnetwork model $Q_{mB}$ for isolating the base terminal B of the bipolar junction transistor Q shown in FIG. 12;

FIG. 18 illustrates a three by three matrix that represents an indefinite admittance matrix (IAM) for the voltage controlled voltage source (VCVS) terminated subnetwork model $Q_{mE}$ for isolating the emitter terminal E of the bipolar junction transistor Q shown in FIG. 12;

DETAILED DESCRIPTION OF THE INVENTION

FIGS. 1 through 22, discussed below, and the various embodiments used to describe the principles of the present invention in this patent document are by way of illustration only and should not be construed in any way to limit the scope of the invention. Those skilled in the art will understand that the principles of the present invention may be implemented in any type of suitably arranged feedback circuit.

A typical feedback loop generally contains a diverse variety of electronic components. These components consist of the usual passive elements such as resistors, capacitors, and inductors, and active devices such as bipolar junction transistors (BJT), field-effect transistors (JFET and MOS-FET), and operational amplifiers (op-amps). Complex multi-terminal subcircuits made from combinations of these components are also present in feedback loops. A generalized voltage-controlled, voltage source (VCVS) terminated subnetwork model that is suitable for representing a general assortment of components may be developed and constructed with the aid of an indefinite admittance matrix (IAM).

The IAM serves as a basis for establishing equivalency between the model and the components being modeled because it is an equicofactor matrix containing the natural frequencies of the components. Because these frequencies remain invariant with the selection of the reference or ground terminal that is assigned to the component, conditions of equivalency can be determined by comparing the IAMs of the component and its model without regard to the actual placement of the reference or ground terminal.

Figure 1:
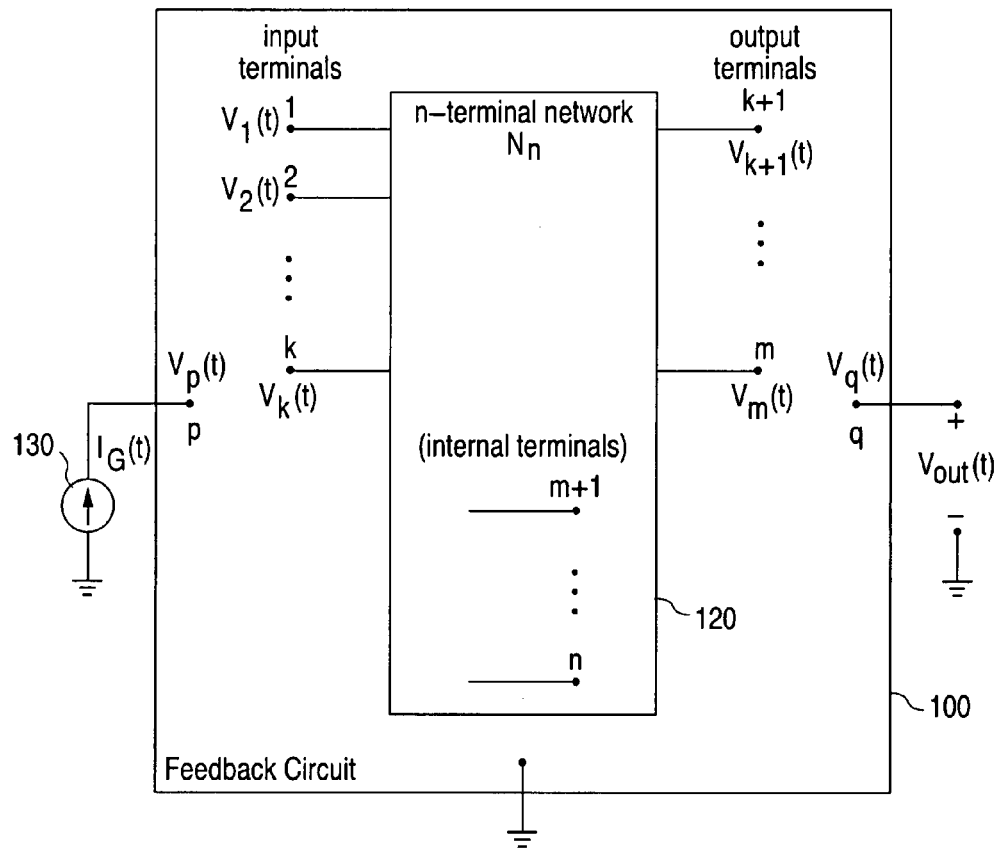
FIG. 1 illustrates a feedback circuit comprising an "n"-terminal network $N_n$.

FIG. 1 illustrates a diagrammatical representation of a feedback circuit 100 that comprises a multi-terminal network 120. The input point "p" of feedback circuit 100 experiences a voltage $V_P(t)$. A current source 130 that generates an input current equal to $I_G(t)$ is connected to the input point "p". The output point "q" of feedback circuit 100 experiences an output voltage $V_q(t)$. The output voltage of feedback circuit 100 is measured between ground and the output point "q". The value of the output voltage of feedback circuit 100 is $V_{out}(t)$.

The multi-terminal network 120 within feedback circuit 100 may also be referred to as an n-terminal network ($N_n$) 120. The n-terminal network ($N_n$) 120 has "k" input terminals (input terminals "1" through "k"). Each input terminal experiences an input voltage. Input terminal "1" experiences input voltage $V_1(t)$, input terminal "2" experiences input voltage $V_2(t)$, and so on. The last input terminal "k" experiences input voltage $V_k(t)$.

The n-terminal network ($N_n$) 120 has "m−k" output terminals (output terminals "k+1" through "m"). Each output terminal experiences an output voltage. Output terminal "k+1" experiences output voltage $V_{k+1}(t)$, output terminal "k+2" experiences output voltage $V_{k+2}(t)$, and so on. The last output terminal "m" experiences output voltage $V_m(t)$.

First, the indefinite admittance matrix (IAM) for the n-terminal network ($N_n$) 120 is characterized. While there are no severe restrictions on the type of components that are contained in $N_n$ 120, it is assumed that $N_n$ 120 does not have any independent voltage and current sources. It is further assumed that there are no dependent voltage sources connected between the terminals of $N_n$ 120 that would cause a violation of Kirchoff's Voltage Law (KVL) to occur when voltage-controlled, voltage sources (VCVSs) are connected to produce the model.

Figure 2:
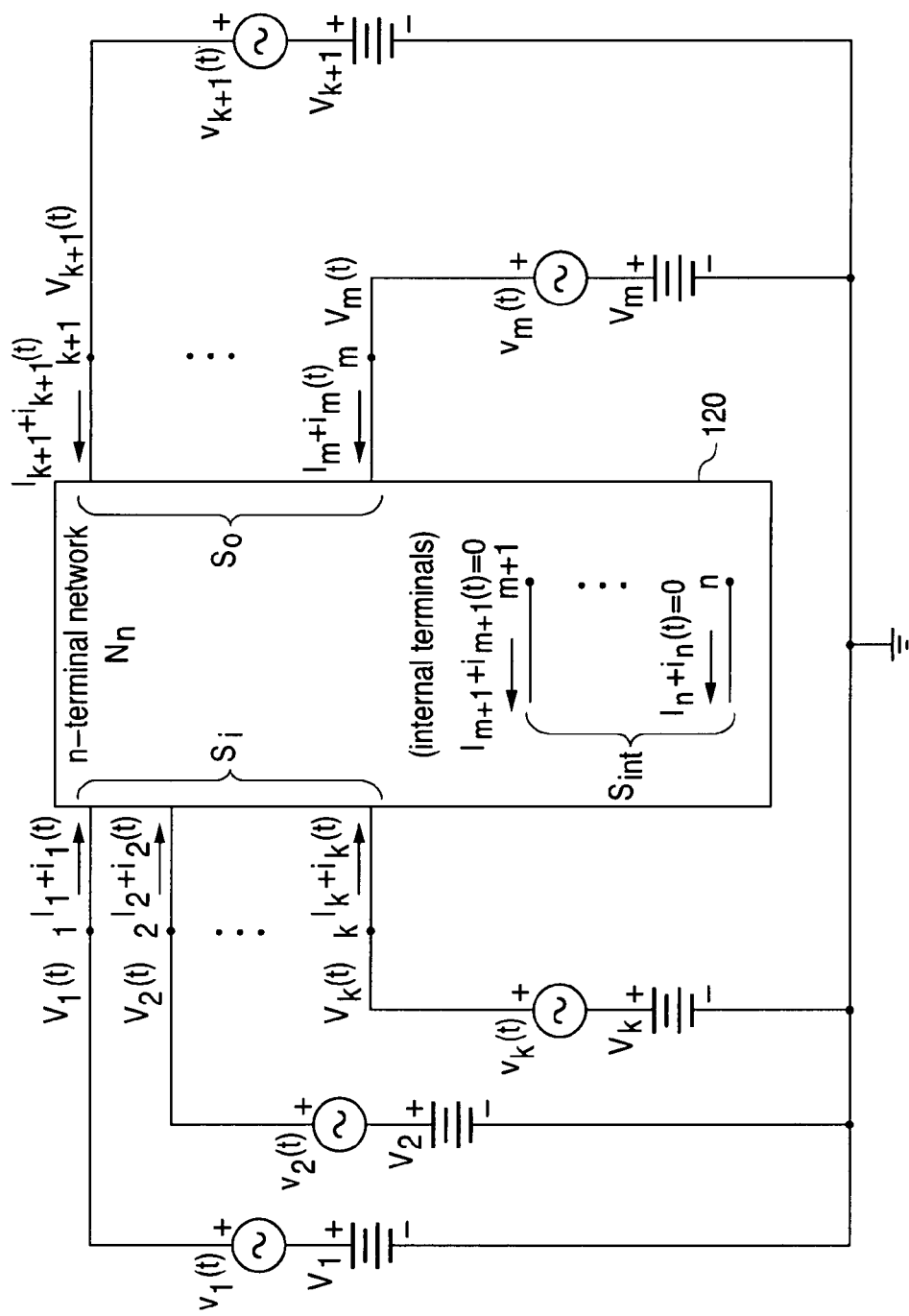
FIG. 2 illustrates the "n"-terminal network $N_n$ of FIG. 1 driven by independent sources.

FIG. 2 illustrates a more detailed view of multi-terminal network 120 showing how multi-terminal network 120 is driven by independent voltage sources. Independent voltage sources ($v_1(t)+V_1$ through $v_m(t)+V_m$) are connected between the terminals of n-terminal network $N_n$ 120 and an arbitrary reference or ground node. These independent voltage sources represent the node voltages that are produced by the circuit connection. The direct current (dc) sources ($V_1$ through $V_m$) correspond to the large-signal components of the node voltages that provide necessary bias for the non-linear active devices while the time-domain sources ($v_1(t)$ through $v_m(t)$) correspond to the small-signal components that provide alternating current (ac) excitation to the network.

Terminals "1" through "m" are terminals that are external to $N_n$ 120. Terminals "m+1" through "n" are internal terminals that are open-circuited because they are not accessible for source connections. The terminals "1" through "n" are separated into three distinct sets $S_i$, $S_o$ and $S_{int}$. The set $S_i$ contains terminals "1" through "k" to indicate the input terminals of $N_n$ 120. The set $S_o$ contains terminals "k+1" through "m" to indicate the output terminals of $N_n$ 120. The designations "input" and "output" are determined from the orientation of the terminals with respect to the assigned signal flow around the feedback loop. The set $S_{int}$ contains the internal terminals "m+1" through "n" of $N_n$ 120.

The three sets $S_i$, $S_o$ and $S_{int}$ are denoted with conventional notations as follows:

$$S_i = \{1,2,3,\ldots,k\} \quad (2)$$

$$S_o = \{k+1,k+2,k+3,\ldots,m\} \quad (3)$$

$$S_{int} = \{m+1,m+2,m+3,\ldots,n\} \quad (4)$$

Figure 3:
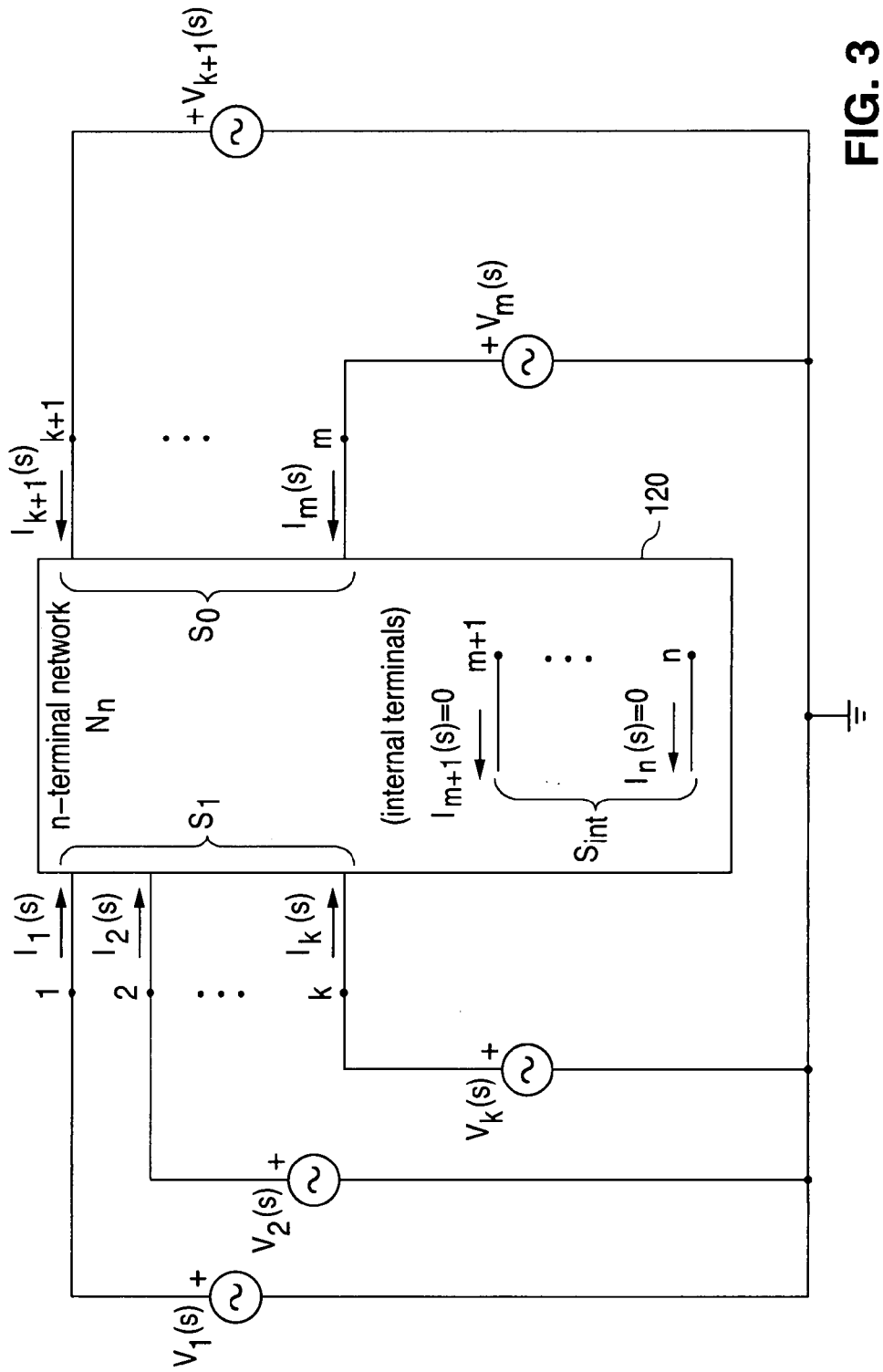
FIG. 3 illustrates a Laplace transformed model of "n"-terminal network $N_n$ of FIG. 2.
Figure 5:
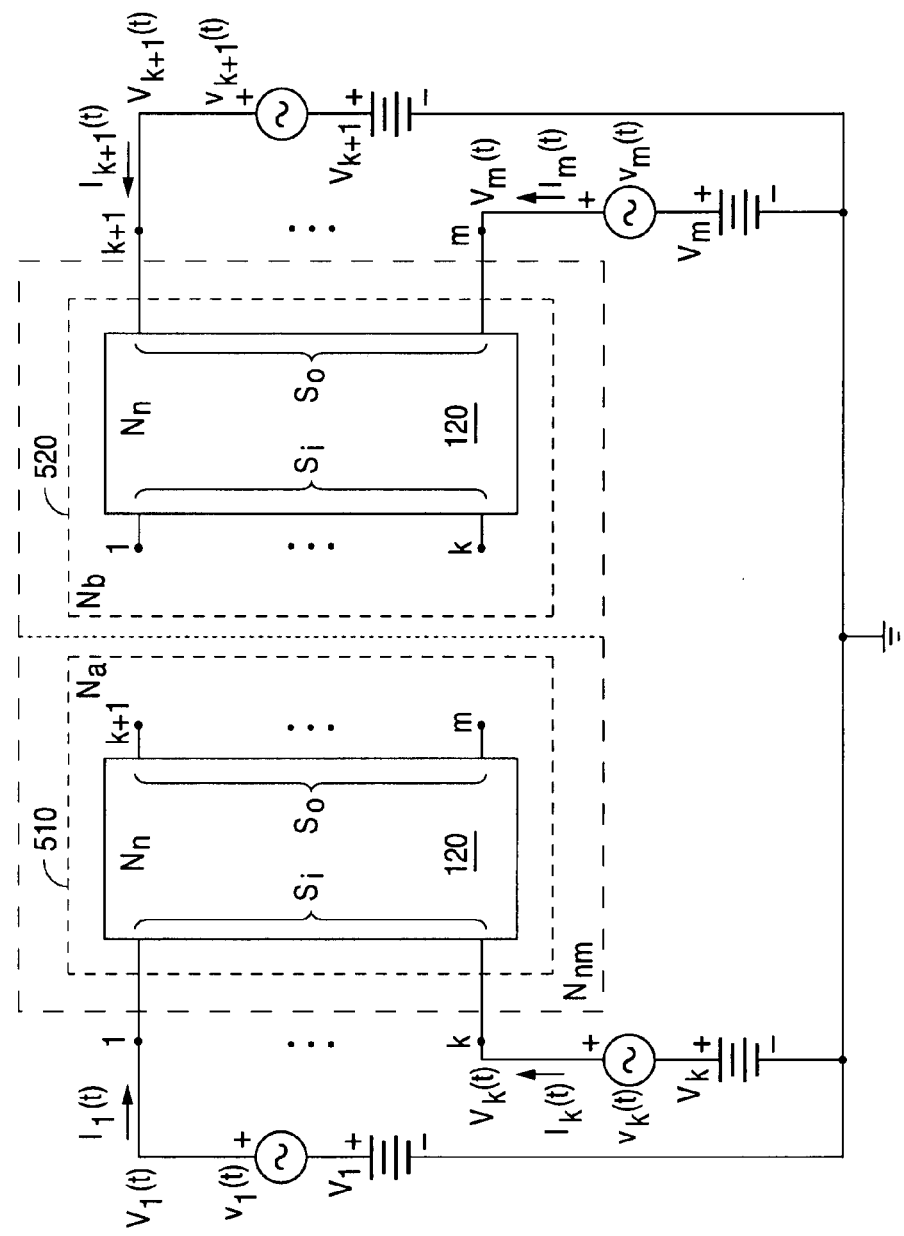
FIG. 5 illustrates an "n"-terminal network $N_{nm}$ that comprises a first subnetwork $N_a$ and a second subnetwork $N_b$.

With the direct current (dc) operating point maintained by the batteries, $N_n$ 120 is transformed into its s-domain equivalent where all components (linear and non-linear) are replaced by linear, small-signal Laplace transform components determined at the operating point. The linearized s-domain model of the network is shown in FIG. 3 where all of the terminal voltages and currents are Laplace transform variables. The mathematical relationship that describes the terminal currents as a function of the terminal voltages may be written in the form of a partitioned matrix equation. The partitioned matrix equation has the form:

$$\underline{I}(s) = [Y_{IAMn}(s)] \cdot \underline{V}(s) \quad (5)$$

$\underline{I}(s)$ represents a "1 by n" column matrix of the terminal currents. $\underline{V}(s)$ represents a "1 by n" column matrix of the terminal voltages. $[Y_{IAMNn}(s)]$ is a "n by n" matrix that represents the indefinite admittance matrix (IAM). FIG. 4 shows a more detailed view of the partitioned matrix equation (5) and its individual matrix components.

Because the ground node is not specified, the $[Y_{IAMn}(s)]$ matrix is defined as the "primitive" indefinite admittance matrix (IAM). The matrix elements $y_{i,j}(s)$ are Laplace transform admittance terms. The matrix elements $y_{i,j}(s)$ are found by (1) summing the positive of all passive admittances connected to the "i"-th terminal for the diagonal elements $y_{i,i}(s)$, and (2) summing the negative of all passive admittances connected between the terminals "i" and "j" for off-diagonal elements $y_{i,j}(s)$, and (3) adding to elements $y_{i,j}(s)$ the algebraic admittance contributions of all dependent voltage source and current source components.

These steps are applied to all "n" terminals of $N_n$ 120 even if some of the terminals are open-circuited. From the terminals contained in the three sets $S_i$, $S_o$ and $S_{int}$, Equation (5) may be expressed in a more compact form as follows:

$$\begin{bmatrix} I_{Si}(s) \\ I_{So}(s) \\ I_{Sint}(s) \end{bmatrix} = \begin{bmatrix} I_{Si}(s) \\ I_{So}(s) \\ 0 \end{bmatrix} = \begin{bmatrix} Y_{11}(s) & Y_{12}(s) & Y_{13}(s) \\ Y_{21}(s) & Y_{22}(s) & Y_{23}(s) \\ Y_{31}(s) & Y_{32}(s) & Y_{33}(s) \end{bmatrix} \cdot \begin{bmatrix} V_{Si}(s) \\ V_{So}(s) \\ V_{Sint}(s) \end{bmatrix} \quad (6)$$

Although the currents in the terminals in set $S_{int}$ are constrained to be zero, the terminal voltages are unknown and may be eliminated from Equation (6) with a terminal suppression algorithm. Assuming that the submatrix $[Y_{33}(s)]$ is nonsingular, the application of a terminal suppression algorithm yields a reduced form for Equation (6). The reduced form is:

$$\begin{bmatrix} I_{Si}(s) \\ I_{So}(s) \end{bmatrix} = \quad (7a)$$

$$\begin{bmatrix} Y_{11}(s) - Y_{13}(s)Y_{33}^{-1}(s)Y_{31}(s) & Y_{12}(s) - Y_{13}(s)Y_{33}^{-1}(s)Y_{32}(s) \\ Y_{21}(s) - Y_{23}(s)Y_{33}^{-1}(s)Y_{31}(s) & Y_{22}(s) - Y_{23}(s)Y_{33}^{-1}(s)Y_{32}(s) \end{bmatrix} \cdot$$

$$\begin{bmatrix} V_{Si}(s) \\ V_{So}(s) \end{bmatrix}$$

$$\begin{bmatrix} I_{Si}(s) \\ I_{So}(s) \end{bmatrix} = \begin{bmatrix} Y'_{11}(s) & Y'_{12}(s) \\ Y'_{21}(s) & Y'_{22}(s) \end{bmatrix} \cdot \begin{bmatrix} V_{Si}(s) \\ V_{So}(s) \end{bmatrix} = [Y'_{IAMNn}(s)] \cdot \begin{bmatrix} V_{Si}(s) \\ V_{So}(s) \end{bmatrix} \quad (7b)$$

The admittance submatrices in the reduced IAM define lateral signal transfer among the terminals in set $S_i$ and in set $S_o$. Signal transfer is characterized by excitation and response at the terminals so that each submatrix is described as a matrix response function where:

(1) $[Y'_{11}(s)]$ is a "k by k" submatrix of driving-point and transadmittance functions established from the voltage excitations and current responses applied to and taken from the terminals in set $S_i$.

(2) $[Y'_{22}(s)]$ is a "(m–k) by (m–k)" submatrix of driving-point and transadmittance functions established from the voltage excitations and current responses applied to and taken from the terminals in set $S_o$.

(3) $[Y'_{12}(s)]$ is a "k by (m–k)" submatrix of transadmittance functions established from the voltage excitations applied to the terminals in set $S_o$ and the current responses taken from the terminals in set $S_i$. The $[Y'_{12}(s)]$ submatrix defines the unilateral signal transfer from output to input.

(4) $[Y'_{21}(s)]$ is a "(m–k) by k" submatrix of transadmittance functions established from the voltage excitations applied to the terminals in set $S_i$ and the current responses taken from the terminals in set $S_o$. The $[Y'_{21}(s)]$ submatrix defines the unilateral signal transfer from input to output.

A model is then constructed that physically separates the input terminals in set $S_i$ from the output terminals in set $S_o$. This characteristic is realized with the model shown in FIG. 5 where subnetwork $N_a$ 510 and subnetwork $N_b$ 520 each contain an exact copy of $N_n$ 120. The terminals in set $S_i$ of $N_n$ 120 in $N_a$ 510 are connected to input terminals "1" through "k" of the model while terminals in set $S_o$ of $N_n$ 120 in $N_b$ 520 are connected to output terminals "k+1" through "m". In other words, set $S_i$ of $N_a$ 510 and set $S_o$ of $N_b$ 520 are transformed into sets $S_i$ and $S_o$, respectively, of the model. However, with the terminals of set $S_o$ of $N_a$ 510 and the terminals of set $S_i$ of $N_b$ 520 open-circuited, it is clear that signals cannot be transferred between the external input and output terminals of the model. This is verified from the matrix equation for the model which is written as:

$$\begin{bmatrix} I_{Si}(s) \\ I_{So}(s) \end{bmatrix} = \begin{bmatrix} Y'_{11a}(s) & 0 \\ 0 & Y'_{22b}(s) \end{bmatrix} \cdot \begin{bmatrix} V_{Si}(s) \\ V_{So}(s) \end{bmatrix} \quad (8)$$

where $[Y'_{11a}(s)] = [Y'_{11}(s)]$ and $[Y'_{22b}(s)] = [Y'_{22}(s)]$ because subnetwork $N_a$ 510 and subnetwork $N_b$ 520 are identical to network $N_n$ 120. However, lateral signal transfer between subnetwork $N_a$ 510 and subnetwork $N_b$ 520 does not exist which causes the off-diagonal submatrices to be zero.

By connecting grounded VCVSs to the open-circuited terminals in the subnetwork $N_a$ 510 and subnetwork $N_b$ 520, lateral signal transfer through the model is established without a physical connection existing between the subnetworks. This is illustrated in the network $N_{nm}$ 600 of FIG. 6 where the controlling voltages for the sources are taken from the external terminals of the model. That is, the voltages that control the VCVSs connected to the terminals in set $S_o$ of $N_a$ 510 are the voltages at the terminals in set $S_o$ of $N_b$ 520 and those that control the VCVSs connected to terminals in $S_i$ of $N_b$ 520 are the voltages at the terminals in set $S_i$ of $N_a$ 510. The matrix equation that describes this VCVS-terminated subnetwork model may be written as:

$$\begin{bmatrix} I_{Si}(s) \\ I_{So}(s) \end{bmatrix} = \begin{bmatrix} Y'_{11a}(s) & Y'_{12a}(s)M_{So} \\ Y'_{21b}(s)M_{Si} & Y'_{22b}(s) \end{bmatrix} \cdot \begin{bmatrix} V_{Si}(s) \\ V_{So}(s) \end{bmatrix} = \quad (9)$$

$$[Y'_{IAMNnm}(s)] \cdot \begin{bmatrix} V_{Si}(s) \\ V_{So}(s) \end{bmatrix}$$

The multipliers $[M_{Si}]$ and $[M_{So}]$ are diagonal matrices containing gain parameters of the VCVSs connected to the terminals in set $S_i$ and in set $S_o$ internal to the model.

$$[M_{Si}] = \begin{bmatrix} \mu_1 & 0 & \cdots & 0 \\ 0 & \mu_2 & \cdots & 0 \\ \vdots & \vdots & \ddots & \vdots \\ 0 & 0 & \cdots & \mu_k \end{bmatrix}_{k \times k} \quad (10)$$

$$[M_{So}] = \begin{bmatrix} \mu_{k+1} & 0 & \cdots & 0 \\ 0 & \mu_{k+2} & \cdots & 0 \\ \vdots & \vdots & \ddots & \vdots \\ 0 & 0 & \cdots & \mu_m \end{bmatrix}_{(m-k) \times (m-k)} \quad (11)$$

Figure 6:
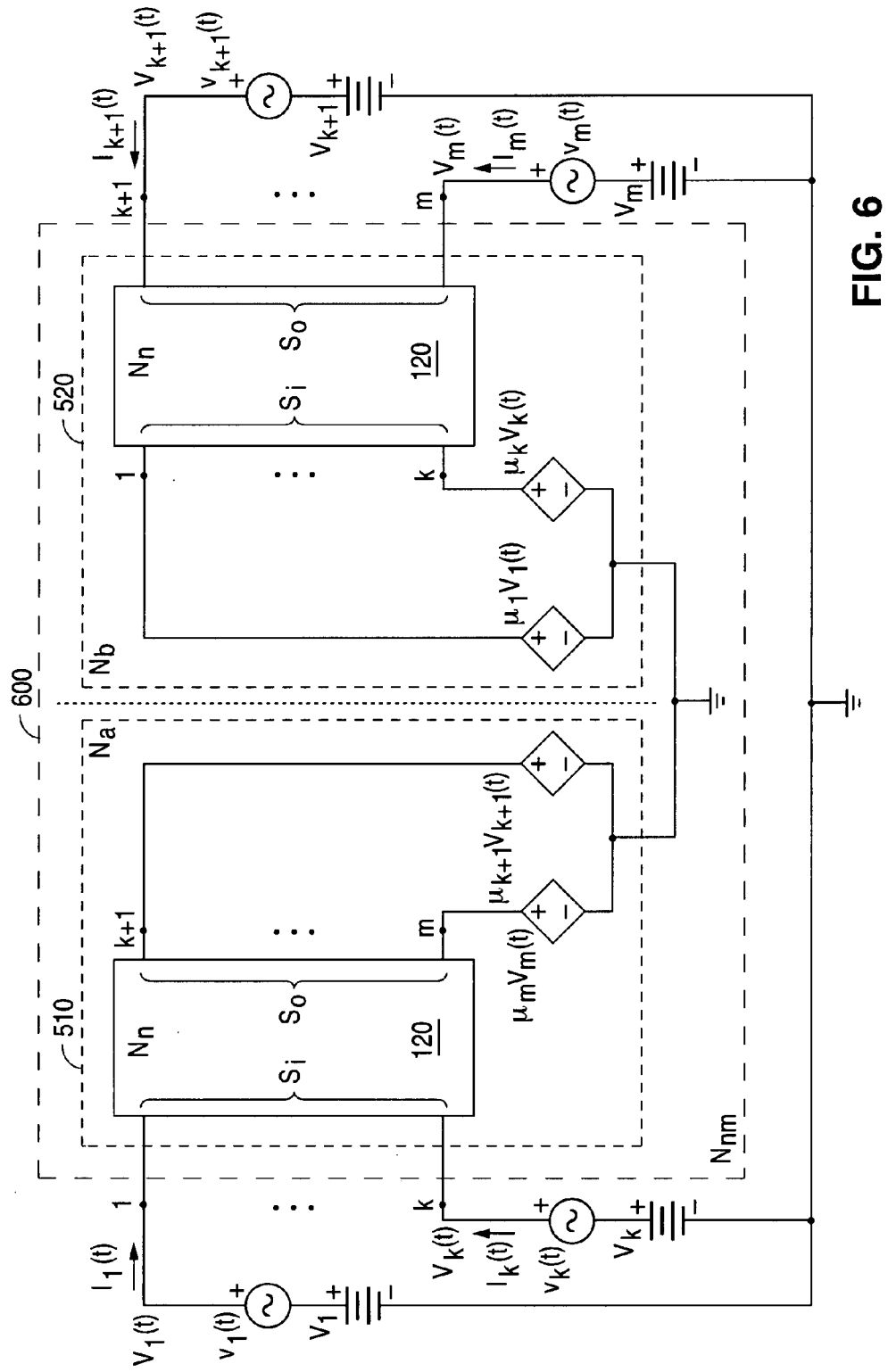
FIG. 6 illustrates a voltage controlled voltage source (VCVS) terminated subnetwork model of the "n"-terminal network $N_n$ of FIG. 2.

Equivalency of the model $N_{nm}$ 600 in FIG. 6 to the original network $N_n$ 120 in FIG. 2 is established by setting the IAMs in Equation (7) and Equation (9) equal. This final step produces two conditions for equivalency. The first condition for equivalency is that the respective submatrices of the IAMs of subnetwork $N_a$ 510 and subnetwork $N_b$ 520 must be equal to those of network $N_n$ 120. This first condition may be expressed mathematically as follows:

$$[Y'_{11a}(s)] = [Y'_{11b}(s)] = [Y'_{11}(s)] \quad (12)$$

$$[Y'_{12a}(s)] = [Y'_{12b}(s)] = [Y'_{12}(s)] \quad (13)$$

$$[Y'_{21a}(s)] = [Y'_{21b}(s)] = [Y'_{21}(s)] \quad (14)$$

$$[Y'_{22a}(s)] = [Y'_{22b}(s)] = [Y'_{22}(s)] \quad (15)$$

This is a result of construction because subnetwork $N_a$ 510 and subnetwork $N_b$ 520 each contain identical copies of $N_n$ 120.

The second condition for equivalency is that all VCVS gains must be equal to unity so that the matrices $[M_{Si}]$ and $[M_{So}]$ are identity matrices. This second condition may be expressed mathematically as follows:

$$[M_{Si}] = \begin{bmatrix} 1 & 0 & \cdots & 0 \\ 0 & 1 & \cdots & 0 \\ \vdots & \vdots & \ddots & \vdots \\ 0 & 0 & \cdots & 1 \end{bmatrix}_{k \times k} = [U_k] \quad (16)$$

$$[M_{So}] = \begin{bmatrix} 1 & 0 & \cdots & 0 \\ 0 & 1 & \cdots & 0 \\ \vdots & \vdots & \ddots & \vdots \\ 0 & 0 & \cdots & 1 \end{bmatrix}_{(m-k) \times (m-k)} = [U_{m-k}] \quad (17)$$

There are some significant properties of $N_{nm}$ 600 that allow it to satisfy four important specifications (listed below) required in a loop breaking application. First, the components contained in $N_n$ 120 can be linear or non-linear because they are modeled as linear, small-signal s-domain admittances determined at the large-signal direct current (dc) operating point of the circuit. This operating point is established equally in subnetwork $N_a$ 510 and subnetwork $N_b$ 520 because both the direct current (dc) voltages and the alternating current (ac) voltages are transferred to the terminals of subnetwork $N_a$ 510 and subnetwork $N_b$ 520 by the VCVSs.

Second, from the topology shown in FIG. 6, the model has no physical connection (except at the ground terminal) between the input terminals in set $S_i$ and the output terminals in set $S_o$. The vertical dashed line between subnetwork $N_a$ 510 and subnetwork $N_b$ 520 shown in FIG. 5 and in FIG. 6 emphasizes the absence of a physical connection between the two subnetworks. Because the "m" external terminals were separated into the sets $S_i$ and $S_o$, it is clear that there are other models that exist with two sets of disconnected input terminals and output terminals. Considering the number of combinations possible with "m" items separated into two distinct sets, it can be shown that the total number of non-duplicated model configurations can be expressed mathematically as follows:

$$\text{Total number of model configurations} = \frac{1}{2} \sum_{i=1}^{m-1} C_i^m \quad (18)$$

Third, the VCVS gains independently control lateral signal transfer between subnetworks and, therefore, between the physically disconnected input terminals and output terminals of the model. Specifically, the gain parameter matrix $[M_{Si}]$ controls signal transfer from the input terminals in set $S_i$ to the output terminals in set $S_o$ and the gain parameter matrix $[M_{So}]$ controls signal transfer from the output terminals in set $S_o$ to the input terminals in set $S_i$. With the gains in these matrices assigned a binary value of either one ("1") or zero ("0"), signals can be transferred through the model in a bilateral, unilateral, or neither bilateral nor unilateral manner as indicated in TABLE ONE below. This method of independent switch-like control is not allowed in network $N_n$ 120 because signal transfer is continually present due to the physical connection between the terminals of network $N_n$ 120.

TABLE ONE

Lateral Signal Properties of $N_{nm}$ 120

| Signal Transfer | $\mu_1$ through $\mu_k$ | $\mu_{k+1}$ through $\mu_m$ |
|---|---|---|
| Bilateral | 1 | 1 |
| Unilateral Input to Output | 1 | 0 |
| Unilateral Output to Input | 0 | 1 |
| Neither Bilateral nor Unilateral | 0 | 0 |

Fourth, and finally, the loading on the terminals in set $S_i$ and set $S_o$ in FIG. 6 is provided by the subnetwork $N_a$ 510 and subnetwork $N_b$ 520. This loading is completely unaffected by the parameter values of [$M_{Si}$] and [$M_{So}$] and is identical to the loading provided by network $N_n$ 120 on the same terminals in FIGS. 1 through 3.

An example of the application of the VCVS-terminated subnetwork model will now be demonstrated. In this example the subnetwork model will be used to model a two-terminal component.

Figure 7:
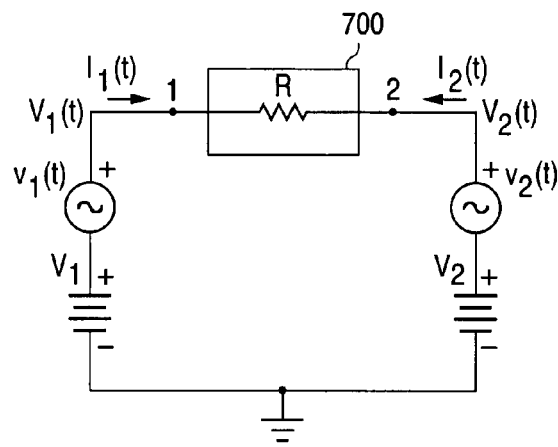
FIG. 7 illustrates a resistor R in a circuit.

Consider a resistor R 700 connected between a pair of nodes as shown in FIG. 7. For the sake of generality, this two-terminal component may also be expressed as a conductance G that is not connected to ground. The indefinite admittance matrix (IAM) for the resistor R is expressed as:

$$[Y_{IAMR}(s)] = \begin{bmatrix} \frac{1}{R} & -\frac{1}{R} \\ -\frac{1}{R} & \frac{1}{R} \end{bmatrix} = \begin{bmatrix} G & -G \\ -G & G \end{bmatrix} \quad (19)$$

Figure 8:
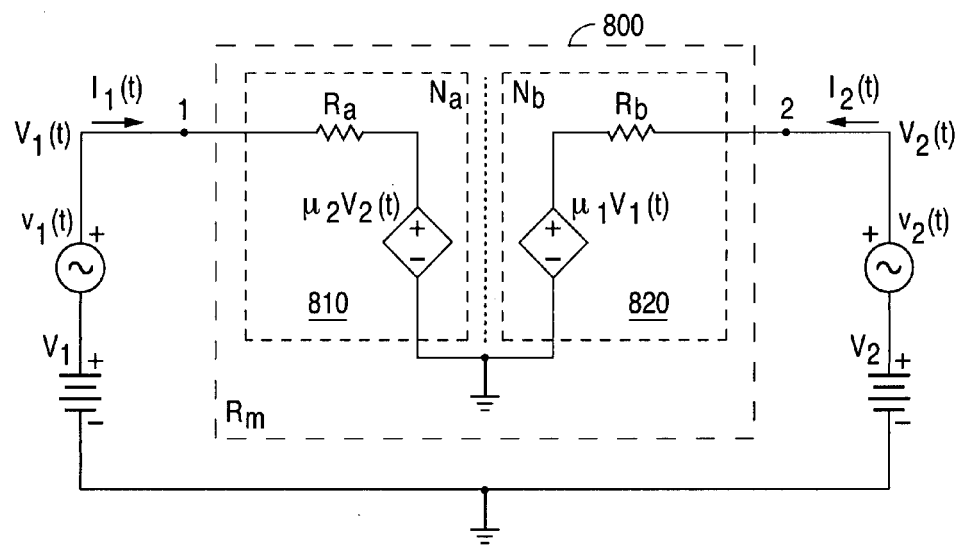
FIG. 8 illustrates a voltage controlled voltage source (VCVS) terminated subnetwork model of the resistor R in the circuit of FIG. 7.

A similar connection between nodes "1" and "2" is established for the circuit shown in FIG. 8 where the resistor R 700 has been replaced by its VCVS-terminated subcircuit model $R_m$ 800. The resistor $R_a$ in subnetwork $N_a$ 810 and the resistor $R_b$ in subnetwork $N_b$ 820 are each identical in value to R 700 and are terminated at one end by ideal VCVSs connected to ground. The ground terminal is designated as an unspecified point so that the IAM for the subnetwork model $R_m$ 800 may be expressed as:

$$[Y_{IAMR_m}(s)] = \begin{bmatrix} \frac{1}{R_a} & -\frac{1}{R_a}\mu_2 \\ -\frac{1}{R_b}\mu_1 & \frac{1}{R_b} \end{bmatrix} = \begin{bmatrix} G_a & -G_a\mu_2 \\ -G_b\mu_1 & G_b \end{bmatrix} \quad (20)$$

These IAMs will be equal as long as (1) the resistors $R_a$ and $R_b$ are each identical in value to resistor R 700 so that $G_a = G_b = G$, and (2) $\mu_1 = \mu_2 = 1$. Under these conditions the model $R_m$ 800 shown in FIG. 8 is an equivalent representation of R 700. Although nodes "1" and "2" are physically disconnected, signal transfer through the model is maintained by the gain parameters $\mu_1$ and $\mu_2$.

A second example of the application of the VCVS-terminated subnetwork model will now be demonstrated. In this example the subnetwork model will be used to model a feedback loop in an inverting-gain amplifier circuit.

Figure 9:
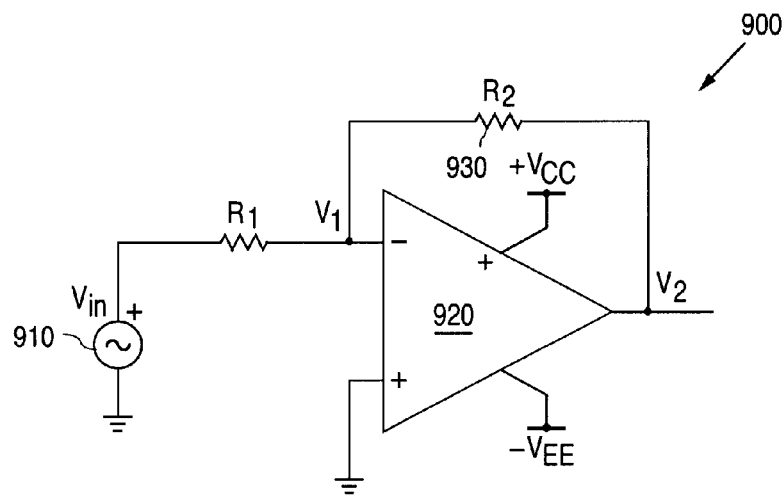
FIG. 9 illustrates the circuit of an inverting-gain amplifier comprising a feedback loop.

FIG. 9 illustrates the circuit of an inverting-gain amplifier 900 comprising a feedback loop. The input to the circuit is the voltage source $V_{in}$ 910. The feedback loop comprises the operational amplifier 920 and resistor $R_2$ 930. Closed-loop signal flow is from the negative input terminal of the operational amplifier 920 (at voltage $V_1$) through the operational amplifier 920 to the output terminal (at voltage $V_2$), from the output terminal through resistor $R_2$ 930, and back to the negative input terminal of the operational amplifier 920.

Figure 10:
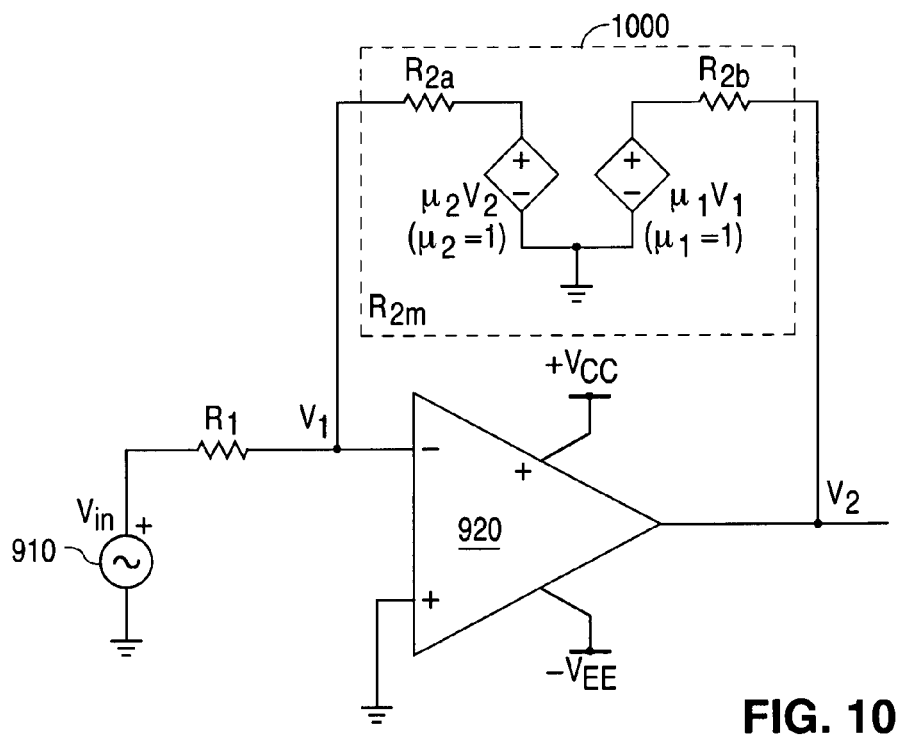
FIG. 10 illustrates the operational amplifier circuit shown in FIG. 9 in which a resistor $R_2$ in the feedback loop has been replaced with a voltage controlled voltage source (VCVS) terminated subnetwork model.

In FIG. 10 the resistor $R_2$ 930 has been replaced by its VCVS-terminated subcircuit model $R_{2m}$ 1000. Resistor $R_{2a}$ and resistor $R_{2b}$ in model $R_{2m}$ 1000 are each equal in value to resistor $R_2$ 930. The VCVS gain parameters $\mu_1$ and $\mu_2$ are each equal to a value of one ("1"). Therefore the circuit in FIG. 9 and the circuit in FIG. 10 are equivalent and both exhibit identical characteristics. However, the model $R_{2m}$ 1000 does not provide a physical connection between the input terminal $V_1$ and the output terminal $V_2$. Bilateral signal flow through model $R_{2m}$ 1000 is produced entirely by the VCVSs in which the gain parameters are equal to a value of one ("1").

Figure 11:
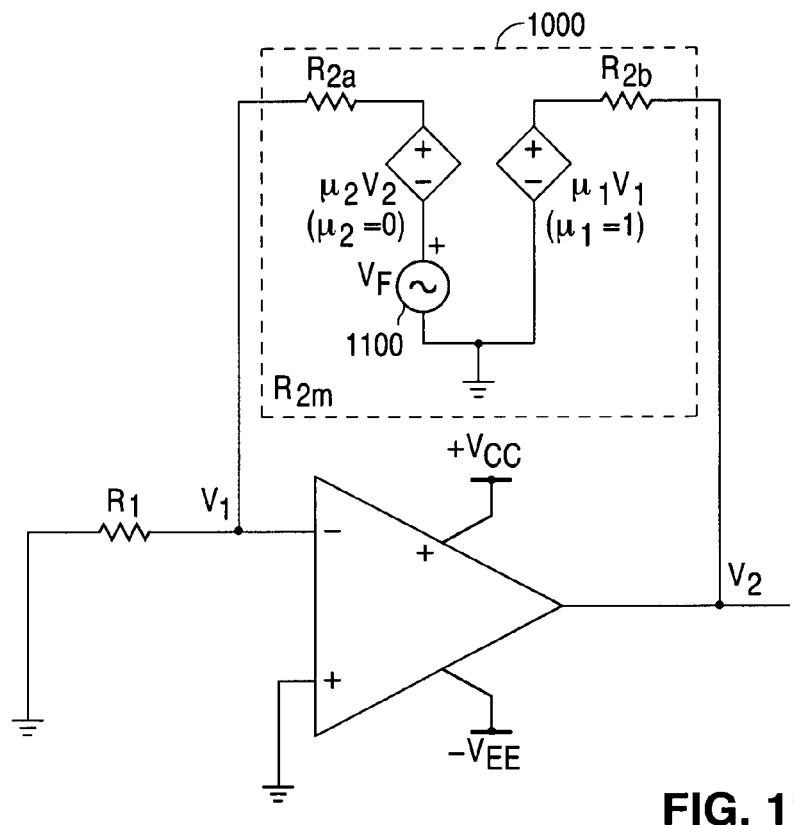
FIG. 11 illustrates the operational amplifier circuit shown in FIG. 10 by which the feedback loop is broken by the voltage controlled voltage source (VCVS) terminated subnetwork model.

FIG. 11 illustrates the operational amplifier circuit shown in FIG. 10 in which the feedback loop is broken in the voltage controlled voltage source (VCVS) terminated subnetwork model $R_{2m}$ 1000. That is, the voltage source $V_{in}$ 910 is removed and an independent voltage source $V_F$ 1100 is placed in model $R_{2m}$ 1000. The gain parameter $\mu 2$ is set equal to a value of zero ("0"). Because the gain parameter $\mu 2$ is zero, lateral signal flow from right to left (i.e., from $V_2$ to $V_1$) is prohibited and the feedback loop is effectively broken. However, lateral signal flow from left to right (i.e., from $V_1$ to $V_2$) through the model is still maintained because the value for the gain parameter $\mu_1$ has not changed and is still equal to a value of one ("1") Because voltage $V_F$ is providing excitation to the feedback loop, the loop-gain is determined from the response to the excitation from $V_F$ at the output terminal $V_2$.

A third example of the application of the VCVS-terminated subnetwork model will now be demonstrated. In this example the subnetwork model will be used to model a three-terminal component.

Figure 12:
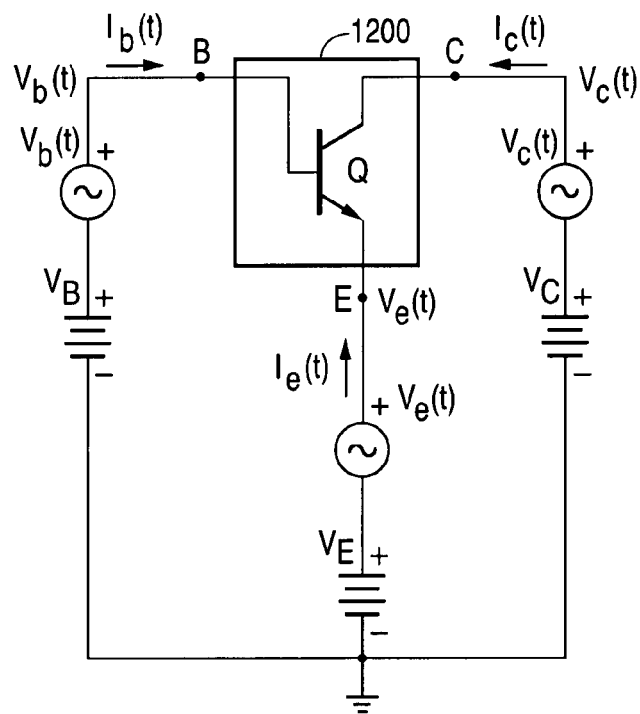
FIG. 12 illustrates a circuit diagram of an NPN bipolar junction transistor Q.
Figure 13:
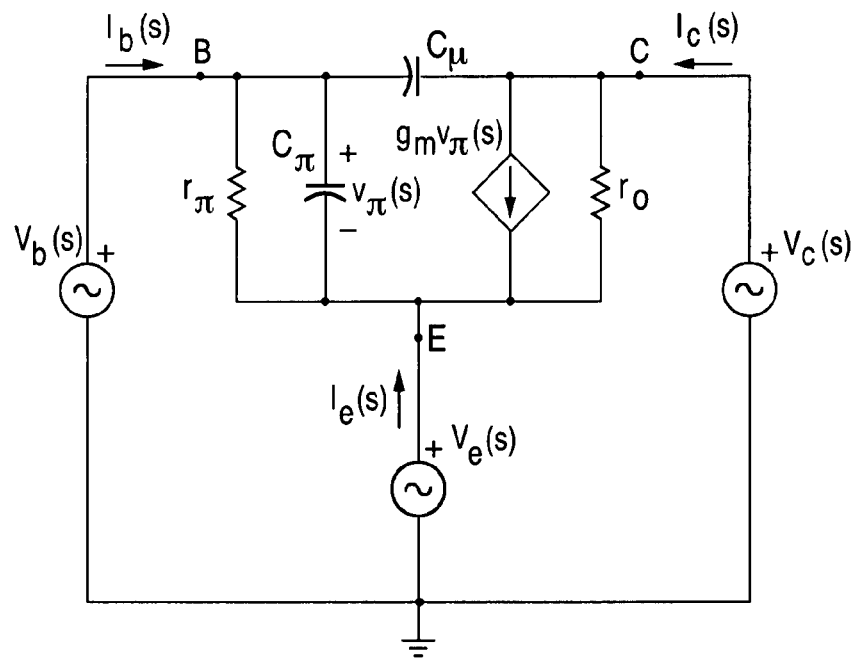
FIG. 13 illustrates a n-model of the bipolar junction transistor Q shown in FIG. 12.

Consider an NPN bipolar junction transistor (BJT) labeled Q 1200 in which the terminals are connected to the voltage sources as shown in FIG. 12. The small-signal, short-circuit admittance parameter model ($\pi$ model) for Q 1200 is shown in FIG. 13. Assuming that none of the nodes is connected to ground and that Q 1200 is properly biased by the batteries, the IAM for this three-terminal component may be expressed as:

$$[Y_{IAMQ}(s)] = \begin{bmatrix} g_\pi + s(C_\pi + C_\mu) & -sC_\mu & -(g_\pi + sC_\pi) \\ -(sC_\mu - g_m) & g_o + sC_\mu & -(g_o + g_m) \\ -(g_m + g_\pi + sC_\pi) & -g_o & g_m + g_o + g_\pi + sC_\pi \end{bmatrix} \quad (21)$$

where the row and column ordering is base (B), collector (C), emitter (E). The admittance elements in this model are determined at the direct current (dc) operating point. From Equation (18) it is seen that there are three possible VCVS-terminated subcircuit models that can be generated for Q 1200.

$$\frac{1}{2}\sum_{i=1}^{2} C_i^3 = \frac{1}{2}(C_1^3 + C_2^3) = 3 \quad (22)$$

Figure 14:
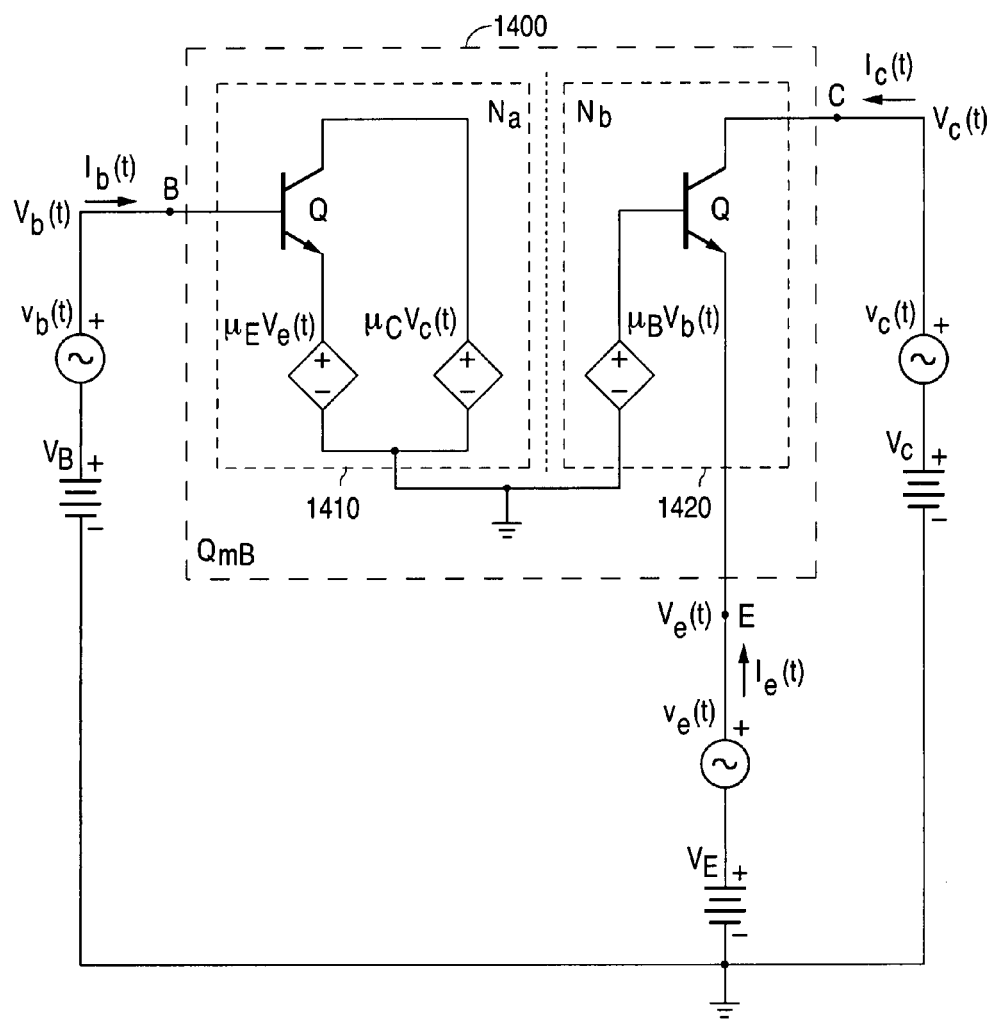
FIG. 14 illustrates a voltage controlled voltage source (VCVS) terminated subnetwork model $Q_{mB}$ for isolating the base terminal B of the bipolar junction transistor Q shown in FIG. 12.

With exact copies of the BJT in subcircuit $N_a$ 1410 and in subcircuit $N_b$ 1420 the model in FIG. 14 (labeled $Q_{mB}$ 1400) is designed to physically separate and isolate the base terminal (the input terminal in set $S_i$) from the collector terminal and the emitter terminal (the output terminals in set $S_o$). This model will be shown to have particular applications for the common-emitter (CE) BJT configuration. Following the same procedure used on $N_n$ 120, the IAM for $Q_{mB}$ 1400 may be expressed as:

$$[Y_{IAMQ_{mB}}(s)] = \begin{bmatrix} Y'_{11a}(s) & Y'_{12a}(s)M_{So} \\ Y'_{21b}(s)M_{Si} & Y'_{22b}(s) \end{bmatrix} \quad (23)$$

where the various submatrices are expressed as:

$$[Y'_{11a}(s)]g_{\pi a} + s(C_{\pi a} + C_{\mu a}) \quad (24)$$

$$[Y'_{12a}(s)M_{So}] = [-sC_{\mu a} - (g_{\pi a} + sC_{\pi a})]\begin{bmatrix} \mu_C & 0 \\ 0 & \mu_E \end{bmatrix} \quad (25)$$

$$[Y'_{12a}(s)M_{So}] = [-sC_{\mu a}\mu_C - (g_{\pi a} + sC_{\pi a})\mu_E] \quad (25a)$$

$$[Y'_{21b}(s)M_{Si}] = \begin{bmatrix} -(sC_{\mu b} - g_{mb}) \\ -(g_{mb} + g_{\pi b} + sC_{\pi b}) \end{bmatrix}[\mu_B] \quad (26)$$

$$[Y'_{21b}(s)M_{Si}] = \begin{bmatrix} -(sC_{\mu b} - g_{mb})\mu_B \\ -(g_{mb} + g_{\pi b} + sC_{\pi b})\mu_B \end{bmatrix} \quad (26a)$$

$$[Y'_{22b}(s)] = \begin{bmatrix} g_{ob} + sC_{\mu b} & -(g_{ob} + g_{mb}) \\ -g_{ob} & g_{mb} + g_{ob} + g_{\pi b} + sC_{\pi b} \end{bmatrix} \quad (27)$$

These submatrices are combined to produce the final form for the IAM of model $Q_{mB}$ 1400. The final form of the IAM of model $Q_{mB}$ 1400 is shown in FIG. 15. The IAM set forth in Equation (21) and the IAM set forth in FIG. 15 will be equal if the respective small-signal components in subnetwork $N_a$ 1410 and subnetwork $N_b$ 1420 and the π-model in FIG. 13 are equal and all the VCVS gain parameters are equal to one ("1"). These conditions may be expressed mathematically as:

$$g_{\pi a} = g_{\pi b} = g_\pi \quad (28)$$

$$g_{ma} = g_{mb} = g_m \quad (29)$$

$$g_{oa} = g_{ob} = g_o \quad (30)$$

$$C_{\pi a} = C_{\pi b} = C_\pi \quad (31)$$

$$C_{\mu a} = C_{\mu b} = C_\mu \quad (32)$$

$$\mu_B = \mu_C = \mu_E = 1 \quad (33)$$

Under these conditions the model $Q_{mB}$ 1400 shown in FIG. 14 is equivalent to the model for Q 1200 shown in FIG. 13 and both contain the same natural frequencies. However, just like the model $R_m$ 800 shown in FIG. 8, the model $Q_{mB}$ 1400 has no physical connection between subcircuit $N_a$ 1410 and subcircuit $N_b$ 1420. The vertical dashed line in FIG. 14 illustrates the absence of a physical connection between the subcircuit $N_a$ 1410 and the subcircuit $N_b$ 1420. Signal transfer between the base terminal and the collector terminal and the emitter terminal is maintained by the VCVSs whose gains are either zero ("0") or one ("1"). For example, with $\mu_C = \mu_E = 1$ and $\mu_B = 0$, signals are transferred from the collector and emitter terminals to the base terminal but not in the opposite direction. That is, no signals are transmitted from the base terminal to the collector and emitter terminals.

Figure 16:
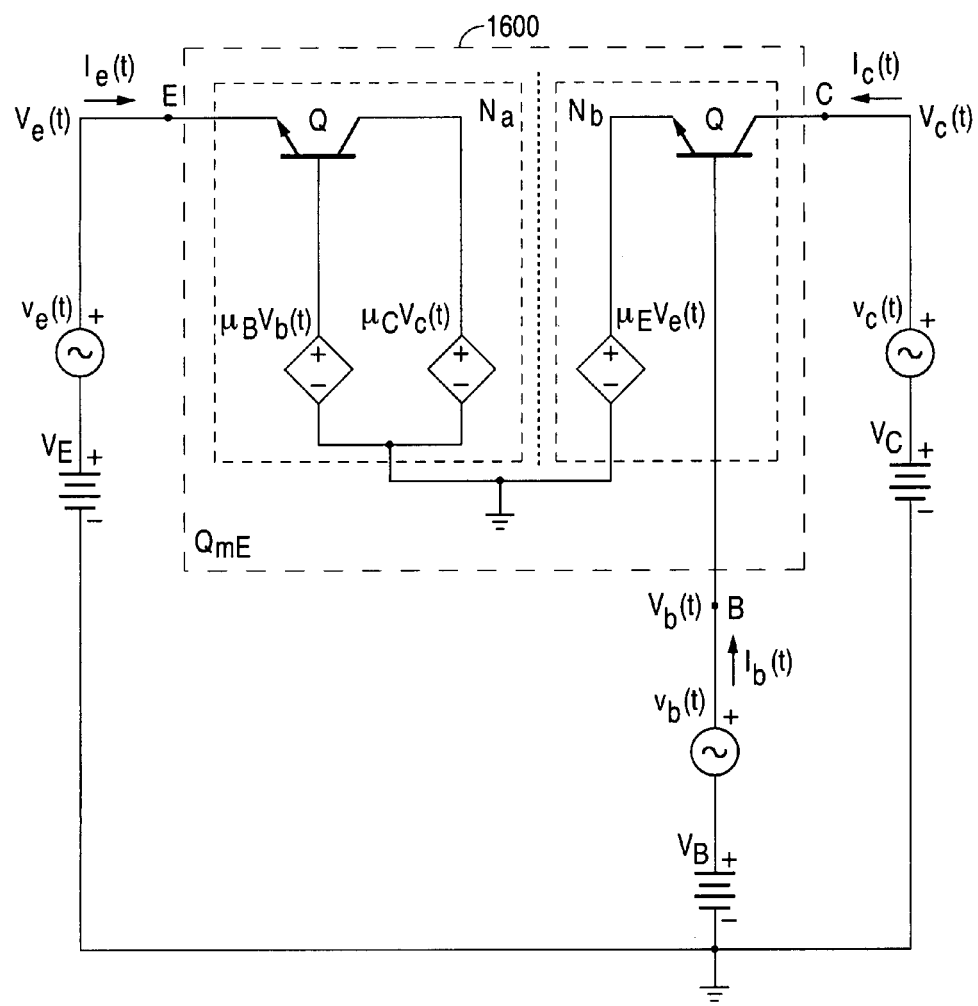
FIG. 16 illustrates a voltage controlled voltage source (VCVS) terminated subnetwork model $Q_{mE}$ for isolating the emitter terminal E of the bipolar junction transistor Q shown in FIG. 12.
Figure 17:
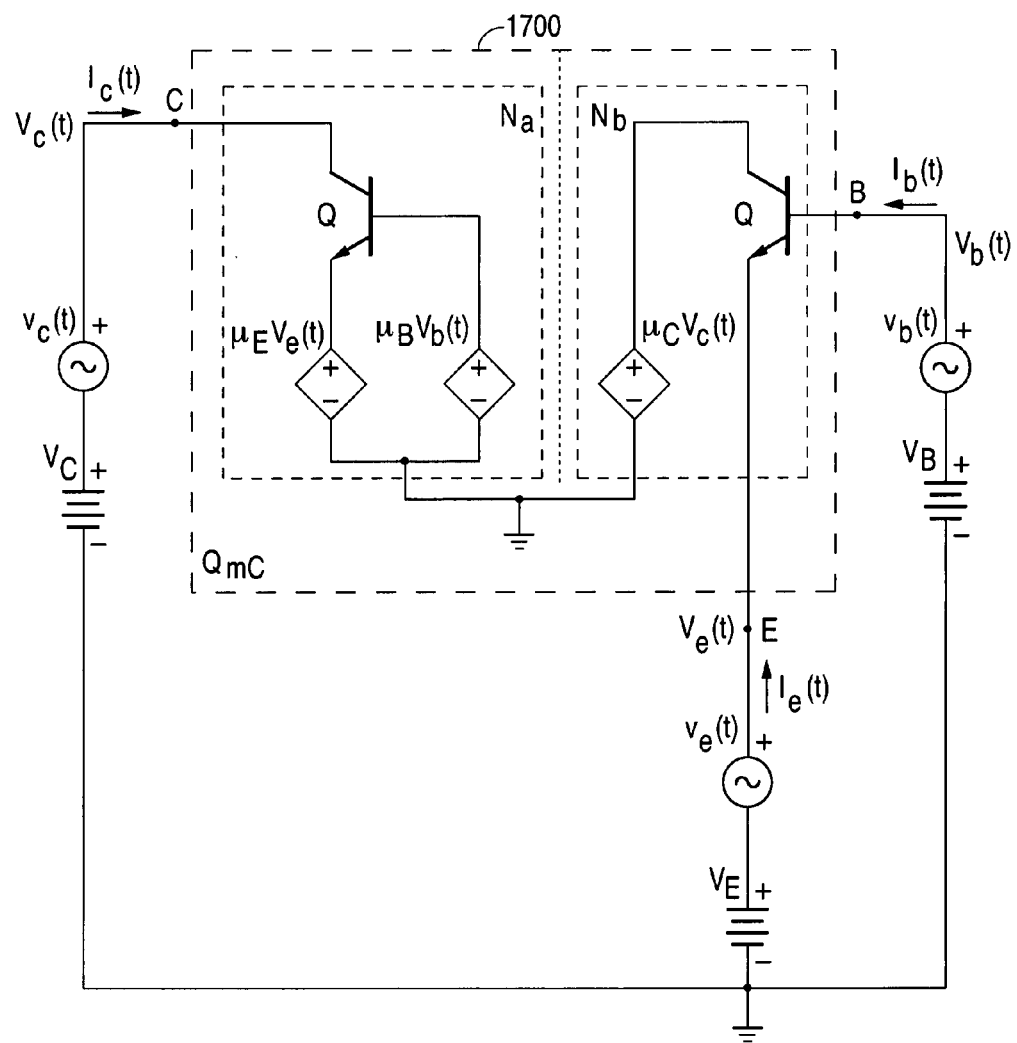
FIG. 17 illustrates a voltage controlled voltage source (VCVS) terminated subnetwork model $Q_{mC}$ for isolating the collector terminal C of the bipolar junction transistor Q shown in FIG. 12.

The other two model configurations for Q 1200 are shown in FIG. 16 and in FIG. 17. The model $Q_{mE}$ 1600 shown in FIG. 16 finds applications in cases where the emitter terminal as the input must be physically separated from the base and collector terminals as outputs. With a matrix ordering of emitter (E), collector (C), base (B), the form of the IAM for the model $Q_{mE}$ 1600 is shown in FIG. 18.

Finally, the collector terminal is isolated from the base and emitter terminals with the model $Q_{mC}$ 1700 shown in FIG. 17. With a matrix ordering of collector (C), base (B), emitter (E), the form of the IAM for the model $Q_{mC}$ 1700 is shown in FIG. 19.

Figures 19, 22:
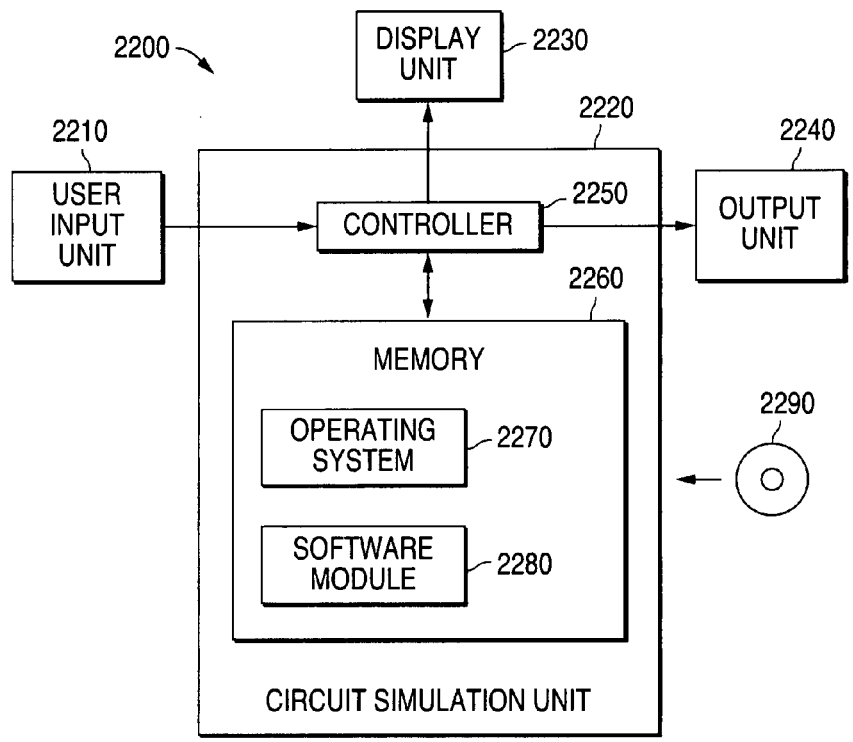
FIG. 19 illustrates a three by three matrix that represents an indefinite admittance matrix (IAM) for the voltage controlled voltage source (VCVS) terminated subnetwork model $Q_{mC}$ for isolating the collector terminal C of the bipolar junction transistor Q shown in FIG. 12.
FIG. 22 illustrates an exemplary software based circuit simulator according to the principles of the present invention.

By proper ordering of the rows and columns, and with the conditions set forth in Equations (28)-(33), it can be shown that the matrix for $[Y_{IAMQmE}(s)]$ shown in FIG. 18 and the matrix for $[Y_{IAMQmC}(s)]$ shown in FIG. 19 are also equal to the matrix for $[Y_{IAMQ}(S)]$ set forth in Equation (21). This means that the three models for Q 1200 (i.e., $Q_{mB}$ 1400, $Q_{mE}$ 1600, and $Q_{mC}$ 1700) are equivalent to the π-model of Q 1200 shown in FIG. 13.

Figure 20:
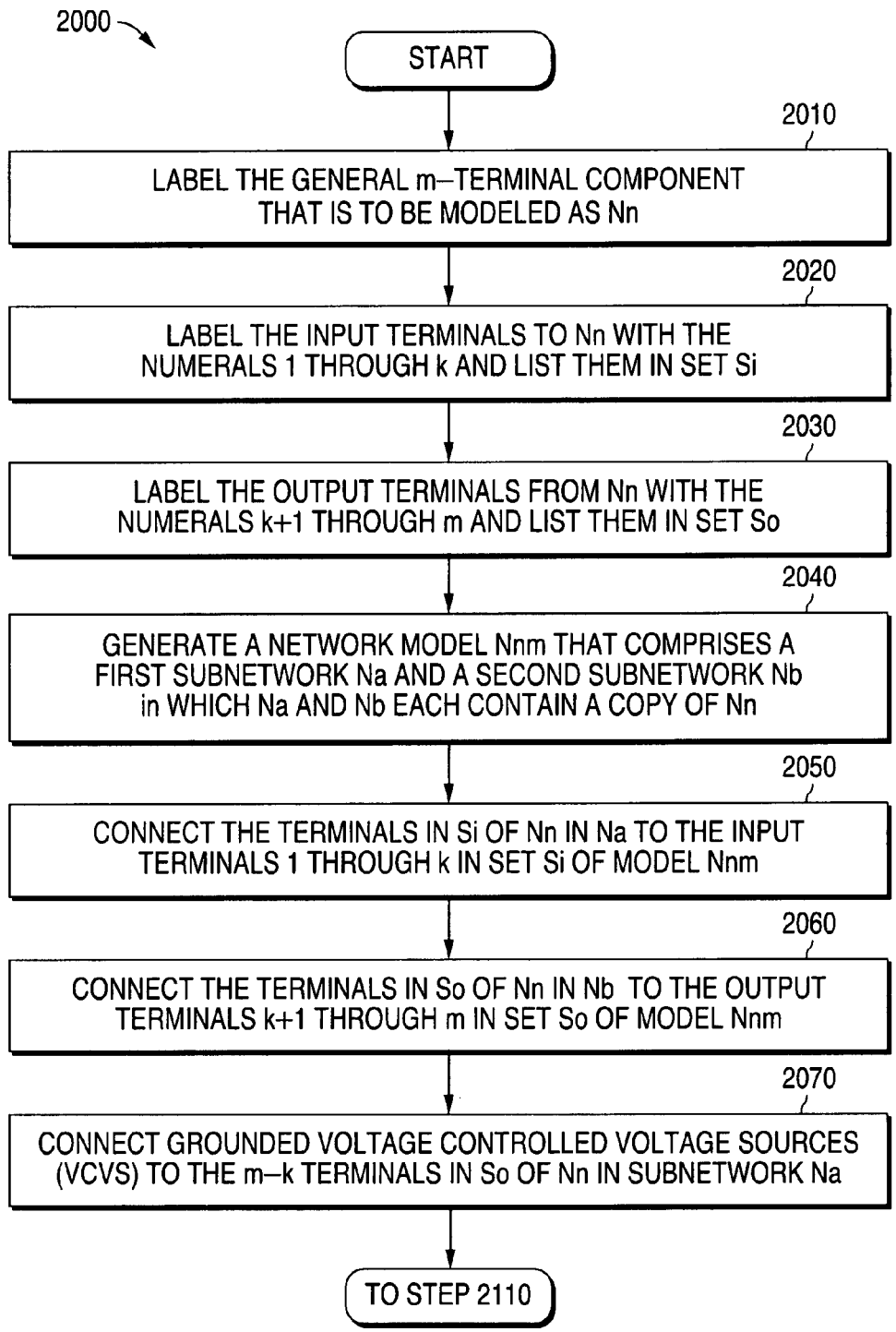
FIG. 20 illustrates a flow chart showing a first portion of the operation of a voltage controlled voltage source (VCVS) terminated subnetwork model according to the principles of the present invention.

FIG. 20 illustrates a flow chart 2000 showing a first portion of the operation of a voltage controlled voltage source (VCVS) terminated subnetwork model according to the principles of the present invention. In the first step the general m-terminal component that is to be modeled is labeled as $N_n$ (step 2010). The input terminals to $N_n$ are labeled with the numerals "1" through "k" and are listed in set $S_i$ (step 2020). The output terminals from $N_n$ are labeled with the numerals "k+1" through "m" and are listed in set $S_o$ (step 2030).

A network model $N_{nm}$ is generated that comprises a first subnetwork $N_a$ and a second subnetwork $N_b$ in which subnetwork $N_a$ and subnetwork $N_b$ each contain a copy of $N_n$ (step 2040). The terminals in $S_i$ of $N_n$ in $N_a$ are connected to the input terminals "1" through "k" in set $S_i$ of the network model $N_{nm}$ (step 2050). The terminals in $S_o$ of $N_n$ in $N_b$ are connected to the output terminals "k+1" through "m" in set $S_o$ of the network model $N_{nm}$ (step 2060). Then grounded voltage controlled voltage sources (VCVSs) are connected to the "m−k" terminals in $S_o$ of $N_n$ in subnetwork $N_a$ (step 2070). Control then passes to step 2110 of FIG. 21.

Figure 21:
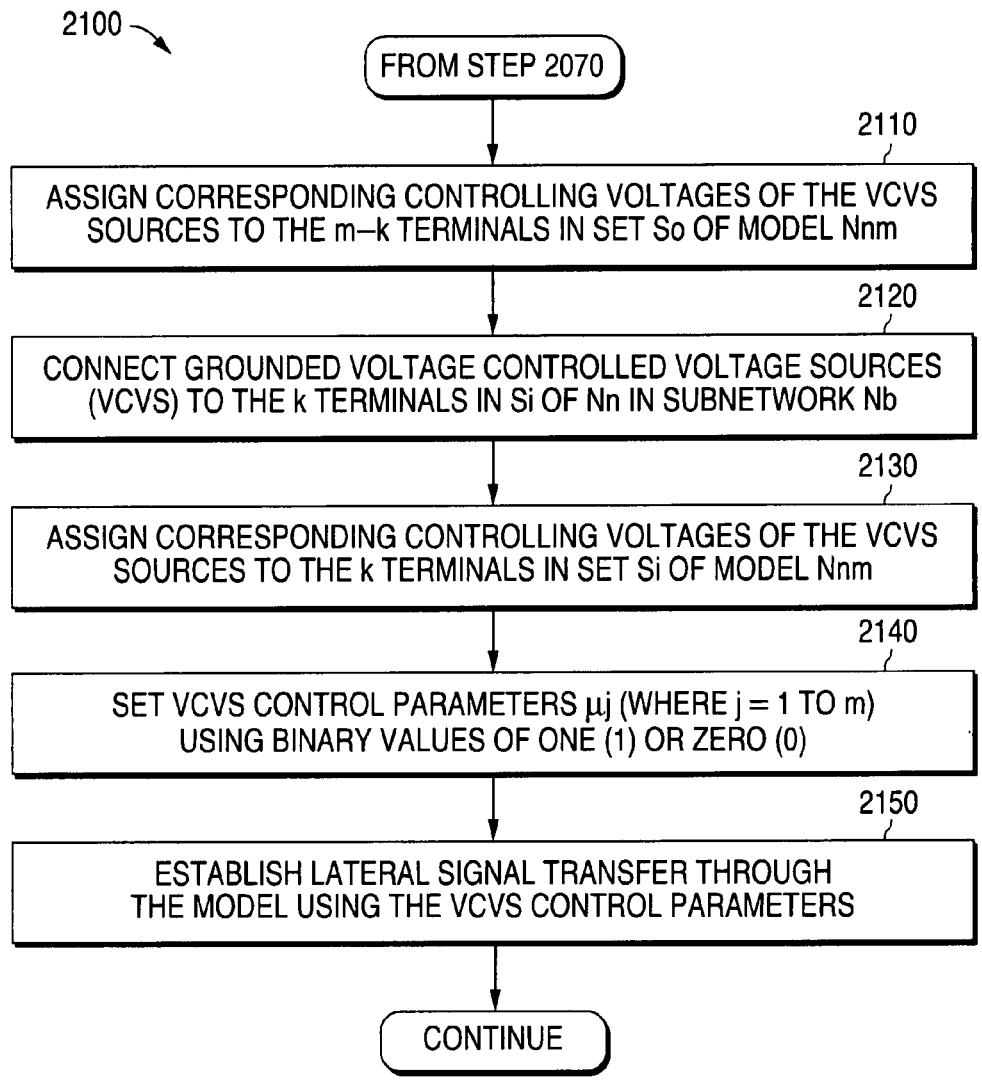
FIG. 21 illustrates a flow chart showing a second portion of the operation of a voltage controlled voltage source (VCVS) terminated subnetwork model according to the principles of the present invention.

FIG. 21 illustrates a flow chart 2100 showing a second portion of the operation of a voltage controlled voltage source (VCVS) terminated subnetwork model according to the principles of the present invention. Control passes to step 2110 from step 2070 of FIG. 20. Corresponding controlling voltages of the VCVS sources are assigned to the "m−k" terminals in set $S_o$ of model $N_{nm}$ (step 2110).

Then grounded voltage controlled voltage sources (VCVSs) are connected to the "k" terminals in $S_i$ of $N_n$ in subnetwork $N_b$ (step 2120). Corresponding controlling voltages of the VCVS sources are assigned to the "k" terminals in set $S_i$ of model $N_{nm}$ (step 2130). The VCVS control parameters $\mu_j$ (where the index j=1 to m) are set using binary values of one ("1") or zero ("0") (step 2140). Then the lateral signal transfer through the model $N_{nm}$ is established using the VCVS control parameters (step 2150).

FIG. 22 illustrates an exemplary circuit simulator 2200 capable of simulating a circuit using the method of the present invention. Circuit simulator 2200 comprises a user input unit 2210, a circuit simulation unit 2220, a display unit 2230, and an output unit 2240. User input unit 2210 may comprise any type of computerized data input unit (e.g., a keyboard, a mouse, a compact disc reader). Display unit 2230 may comprise any type of data display unit (e.g., computer monitor, television screen, liquid crystal display). Output unit 2240 may comprise any type of data output unit (e.g., printer, compact disc recorder, tape recorder).

Circuit simulation unit 2220 comprises a controller unit 2250 and a memory unit 2260. Memory unit 2260 comprises an operating system 2270 and a software module 2280. Software module 2280 comprises computer-executable instructions for performing the steps of the method of the invention.

Controller unit 2250 receives input data from user input unit 2210 that describes the parameters of a circuit that is to be simulated. Controller unit 2250 then accesses the computerized instructions in software module 2280 to perform the simulation using the steps of the method of the invention. Controller then outputs the simulation results to display unit 2230 and to output unit 2240.

Memory 2260 may comprise random access memory (RAM) or a combination of random access memory (RAM) and read only memory (ROM). Memory 2260 may comprise a non-volatile random access memory (RAM) such as flash memory. In an alternate advantageous embodiment, memory 2260 may comprise a mass storage data device, such as a hard disk drive (not shown). Memory 2260 may also include an attached peripheral device or removable disk drives (whether embedded or attached) that reads read/write DVDs or re-writable CD-ROMs. As illustrated schematically in FIG. 22, removable disk drives of this type are capable of receiving and reading re-writable CD-ROM disk 2290. CD-ROM disk 2290 may contain the computer-executable instructions for performing the method of the invention.

Although the present invention has been described with an exemplary embodiment, various changes and modifications may be suggested to one skilled in the art. It is intended that the present invention encompass such changes and modifications as fall within the scope of the appended claims.

What is claimed is:

1. A method for analyzing a feedback circuit that comprises a feedback loop, said method comprising the steps of:
    modeling at least one component of said feedback circuit with an n-terminal network that comprises a first subnetwork and a second subnetwork, wherein said first subnetwork and said second subnetwork are physically disconnected except at ground, and wherein at least one terminal of said first subnetwork and at least one terminal of said second subnetwork are connected to ground through a voltage controlled, voltage source; and
    controlling lateral signal transfer through said n-terminal network using a dependent source parameter of a voltage controlled voltage source.

2. The method as set forth in claim 1 wherein said step of controlling lateral signal transfer through said n-terminal network comprises setting said dependent source parameter to open said feedback loop of said feedback circuit.

3. The method as set forth in claim 2 wherein said step of setting said dependent source parameter to open said feedback loop of said feedback circuit comprises setting a voltage controlled voltage source gain equal to zero.

4. The method as set forth in claim 1 wherein said step of controlling lateral signal transfer through said n-terminal network comprises setting said dependent source parameter to close said feedback loop of said feedback circuit.

5. The method as set forth in claim 4 wherein said step of setting said dependent source parameter to close said feedback loop of said feedback circuit comprises setting a voltage controlled voltage source gain equal to one.

6. The method as set forth in claim 1 wherein said at least one component of said feedback circuit that is modeled with said n-terminal network is a linear component.

7. The method as set forth in claim 6 wherein said at least one linear component of said feedback circuit is not modeled as a two port component.

8. The method as set forth in claim 1 wherein said at least one component of said feedback circuit that is modeled with said n-terminal network is a non-linear component.

9. The method as set forth in claim 8 wherein said at least one non-linear component of said feedback circuit is not modeled as a two port component.

10. For use in a software based circuit simulator capable of simulating a circuit, computer-executable instructions stored on a computer-readable storage medium for analyzing a feedback circuit that comprises a feedback loop, wherein the computer-executable instructions comprise the steps of:
    modeling at least one component of said feedback circuit with an n-terminal network that comprises a first subnetwork and a second subnetwork, wherein said first subnetwork and said second subnetwork are physically disconnected except at ground, and wherein at least one terminal of said first subnetwork and at least one terminal of said second subnetwork are connected to ground through a voltage controlled, voltage source; and
    controlling lateral signal transfer through said n-terminal network using a dependent source parameter of a voltage controlled voltage source.

11. The computer-executable instructions stored on a computer-readable storage medium as set forth in claim 10 wherein said step of controlling lateral signal transfer through said n-terminal network comprises setting said dependent source parameter to open said feedback loop of said feedback circuit.

12. The computer-executable instructions stored on a computer-readable storage medium as set forth in claim 11 wherein said step of setting said dependent source parameter to open said feedback loop of said feedback circuit comprises setting a voltage controlled voltage source gain equal to zero.

13. The computer-executable instructions stored on a computer-readable storage medium as set forth in claim 10 wherein said step of controlling lateral signal transfer through said n-terminal network comprises setting said dependent source parameter to close said feedback loop of said feedback circuit.

14. The computer-executable instructions stored on a computer-readable storage medium as set forth in claim 13 wherein said step of setting said dependent source parameter to close said feedback loop of said feedback circuit comprises setting a voltage controlled voltage source gain equal to one.

15. A software based circuit simulator that is capable of simulating a circuit comprising a controller that is capable of executing computer-executable instructions for analyzing a feedback circuit that comprises a feedback loop, wherein the computer-executable instructions comprise the steps of:

modeling at least one component of said feedback circuit with an n-terminal network that comprises a first subnetwork and a second subnetwork, wherein said first subnetwork and said second subnetwork are physically disconnected except at ground, and wherein at least one terminal of said first subnetwork and at least one terminal of said second subnetwork are connected to ground through a voltage controlled, voltage source; and controlling lateral signal transfer through said n-terminal network using a dependent source parameter of a voltage controlled voltage source.

16. The software based circuit simulator as set forth in claim 15 wherein said step of controlling lateral signal transfer through said n-terminal network comprises setting said dependent source parameter to open said feedback loop of said feedback circuit.

17. The software based circuit simulator as set forth in claim 16 wherein said step of setting said dependent source parameter to open said feedback loop of said feedback circuit comprises setting a voltage controlled voltage source gain equal to zero.

18. The software based circuit simulator as set forth in claim 15 wherein said step of controlling lateral signal transfer through said n-terminal network comprises setting said dependent source parameter to close said feedback loop of said feedback circuit.

19. The software based circuit simulator as set forth in claim 18 wherein said step of setting said dependent source parameter to close said feedback loop of said feedback circuit comprises setting a voltage controlled voltage source gain equal to one.

* * * * *

UNITED STATES PATENT AND TRADEMARK OFFICE
CERTIFICATE OF CORRECTION

PATENT NO. : 7,334,199 B1
APPLICATION NO. : 10/793304
DATED : February 19, 2008
INVENTOR(S) : Howard T. Russell, Jr.

It is certified that error appears in the above-identified patent and that said Letters Patent is hereby corrected as shown below:

Column 5, line 11, delete "n-model" and insert -- π-model --

Column 9, equation 10, delete "
$$[M_{si}] = \begin{bmatrix} \mu_1 & 0 & \cdots & 0 \\ 0 & \mu_2 & \cdots & 0 \\ \vdots & \vdots & \ddots & \vdots \\ 0 & 0 & \cdots & \mu k \end{bmatrix}_{k \times k}$$
" and insert --
$$[M_{si}] = \begin{bmatrix} \mu_1 & 0 & \cdots & 0 \\ 0 & \mu_2 & \cdots & 0 \\ \vdots & \vdots & \ddots & \vdots \\ 0 & 0 & \cdots & \mu k \end{bmatrix}_{k \times k}$$
--

Column 9, equation 11, delete "
$$[M_{so}] = \begin{bmatrix} \mu_{k+1} & 0 & \cdots & 0 \\ 0 & \mu_{k+2} & \cdots & 0 \\ \vdots & \vdots & \ddots & \vdots \\ 0 & 0 & \cdots & \mu_m \end{bmatrix}_{(m-k) \times (m-k)}$$
" and insert --
$$[M_{so}] = \begin{bmatrix} \mu_{k+1} & 0 & \cdots & 0 \\ 0 & \mu_{k+2} & \cdots & 0 \\ \vdots & \vdots & \ddots & \vdots \\ 0 & 0 & \cdots & \mu_m \end{bmatrix}_{(m-k) \times (m-k)}$$
--

Column 10, equation 16, delete "
$$[Msi] = \begin{bmatrix} 1 & 0 & \cdots & 0 \\ 0 & 1 & \cdots & 0 \\ \vdots & \vdots & \ddots & \vdots \\ 0 & 0 & \cdots & 1 \end{bmatrix}_{k \times k} = [U_k]$$
" and insert --
$$[Msi] = \begin{bmatrix} 1 & 0 & \cdots & 0 \\ 0 & 1 & \cdots & 0 \\ \vdots & \vdots & \ddots & \vdots \\ 0 & 0 & \cdots & 1 \end{bmatrix}_{k \times k} = [U_k]$$
--

UNITED STATES PATENT AND TRADEMARK OFFICE
CERTIFICATE OF CORRECTION

PATENT NO. : 7,334,199 B1
APPLICATION NO. : 10/793304
DATED : February 19, 2008
INVENTOR(S) : Howard T. Russell, Jr.

It is certified that error appears in the above-identified patent and that said Letters Patent is hereby corrected as shown below:

Column 10, equation 17, delete "
$$[Mso] = \begin{bmatrix} 1 & 0 & \cdots & 0 \\ 0 & 1 & \cdots & 0 \\ \vdots & \vdots & \ddots & \vdots \\ 0 & 0 & \cdots & 1 \end{bmatrix}_{(m-k)\times(m-k)} = [U_{m-k}]$$
" and insert --
$$[Mso] = \begin{bmatrix} 1 & 0 & \cdots & 0 \\ 0 & 1 & \cdots & 0 \\ \vdots & \vdots & \ddots & \vdots \\ 0 & 0 & \cdots & 1 \end{bmatrix}_{(m-k)\times(m-k)} = [U_{m-k}]$$
--

Signed and Sealed this

Tenth Day of November, 2009

David J. Kappos
*Director of the United States Patent and Trademark Office*